US012635386B2

(12) United States Patent
Lee et al.

(10) Patent No.: US 12,635,386 B2
(45) Date of Patent: May 19, 2026

(54) DISPLAY DEVICE

(71) Applicant: LG ELECTRONICS INC., Seoul (KR)

(72) Inventors: Myungho Lee, Seoul (KR); Sungho Hwang, Seoul (KR); Chulki Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 91 days.

(21) Appl. No.: 18/796,736

(22) Filed: Aug. 7, 2024

(65) Prior Publication Data

US 2025/0204212 A1    Jun. 19, 2025

(30) Foreign Application Priority Data

Dec. 18, 2023    (KR) ........................ 10-2023-0184307

(51) Int. Cl.
H10K 59/80 (2023.01)

(52) U.S. Cl.
CPC ....... H10K 59/872 (2023.02); H10K 59/8792 (2023.02)

(58) Field of Classification Search
CPC ............. H10K 59/872; H10K 59/8792; H10K 2102/3031; G02F 1/133308
See application file for complete search history.

(56) References Cited

U.S. PATENT DOCUMENTS

2022/0210935 A1*  6/2022  Lee ........................ G06F 1/1652

FOREIGN PATENT DOCUMENTS

| KR | 10-2017-0062343 | 6/2017 | |
| KR | 10-2017-0073958 | 6/2017 | |
| KR | 10-2019-0034975 | 4/2019 | |
| KR | 10-2021-0083018 | 7/2021 | |
| KR | 20210083018 A * | 7/2021 | ........... G06F 1/1652 |
| KR | 10-2024-0098719 | 6/2024 | |

OTHER PUBLICATIONS

Korean Intellectual Property Office Application No. 10-2023-0184307, Notice of Allowance dated Jul. 14, 2025, 2 pages.

* cited by examiner

*Primary Examiner* — Tuan A Hoang
(74) *Attorney, Agent, or Firm* — LEE, HONG, DEGERMAN, KANG & WAIMEY

(57) ABSTRACT

A display device is disclosed. The display device includes a display panel, a transparent panel opposed to the display panel, a side frame coupled to the transparent panel, a belt movably disposed in the side frame, a bar which is moved by the belt, a rotatable roller connected to a lateral side of the display panel, a light-shielding sheet which is coupled both to the bar and to the roller and which is wound around or unwound from the roller, an upper pulley which is positioned at an upper side of the side frame and around which the belt is wound, and a rotatable driving pulley adjacent to a lower side of the side frame and opposed to the light-shielding sheet. The bar includes a piece body and a belt coupler fixed to the belt and rotatably coupled to the piece body.

14 Claims, 34 Drawing Sheets

FIG. 5

FIG. 6

DISPLAY DEVICE

CROSS-REFERENCE TO RELATED APPLICATION

Figure 1:
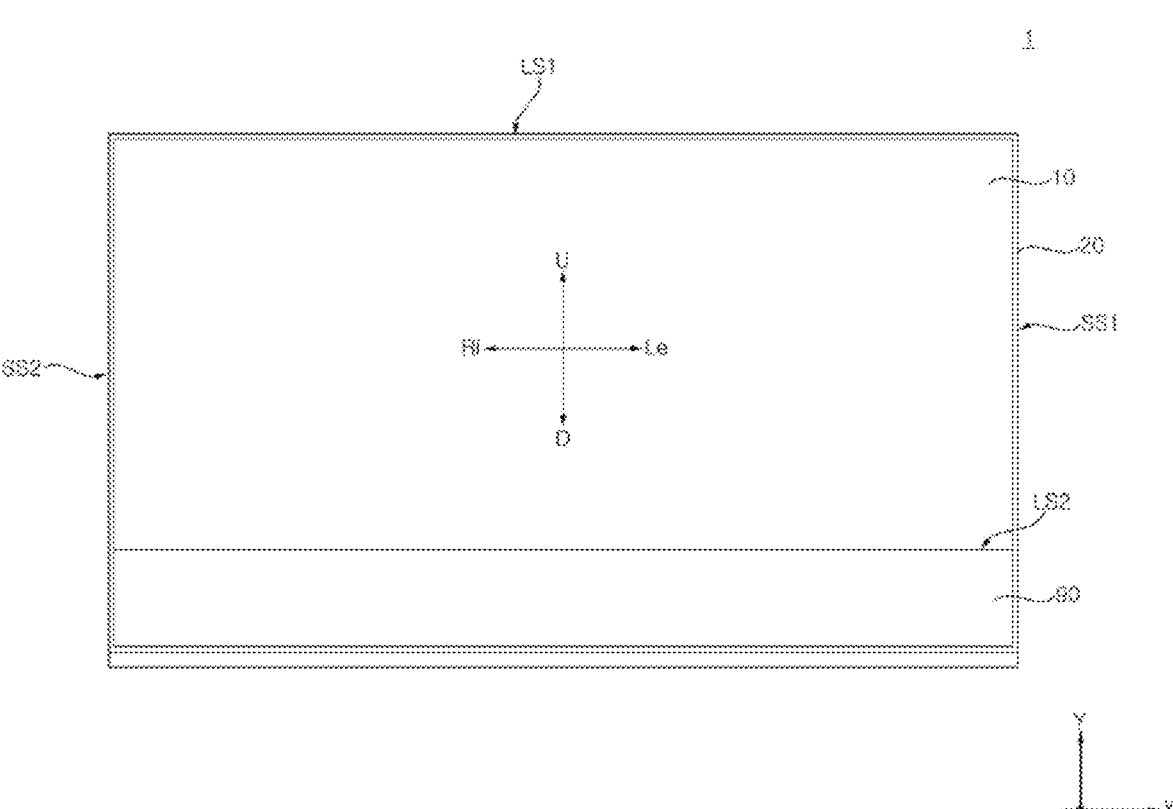

Pursuant to 35 U.S.C. § 119(a), this application claims the benefit of earlier filing date and right of priority to Korean Patent Application No. 10-2023-0184307, filed on Dec. 18, 2023, the contents of which are hereby incorporated by reference herein in its entirety.

BACKGROUND OF THE INVENTION

Field of the Invention

The present disclosure relates to a display device, and more particularly to a display device including a transparent display.

Description of the Related Art

With the development of information society, demand for various kinds of display devices is increasing. In response to this demand, various kinds of display devices, such as LCDs (Liquid Crystal Displays), PDPs (Plasma Display Panels), ELDs (Electro-luminescent Displays), VFDs (Vacuum Fluorescent Displays) and OLEDs (Organic Light-Emitting Diodes) have been recently researched and used.

Thereamong, an LCD panel includes a TFT substrate and a color substrate, which face each other with a liquid crystal layer interposed therebetween, in order to display an image using light supplied from a backlight unit. Meanwhile, an OLED panel is configured to display an image by depositing a self-luminescent organic layer on a substrate having a transparent electrode formed thereon.

In recent years, a great deal of research is being conducted on a transparent display panels capable not only of displaying an image to a user but also of allowing a user to view an object behind the display panel through the display panel.

SUMMARY OF THE INVENTION

It is an object of the present disclosure to solve the above and other problems.

It is another object of the present disclosure to provide a display device including a transparent display panel.

It is another object of the present disclosure to provide a structure and a driving mechanism configured to open and close the rear surface of the transparent display panel.

It is another object of the present disclosure to provide a mechanism of driving a sheet configured to shield the transparent display panel from light.

It is another object of the present disclosure to provide a display device capable of preventing local wearing of a belt caused by operation of the light-shielding sheet.

In order to accomplish the above and other objects, a display device according to one aspect of the present disclosure may include a display panel configured to display an image and having translucency, a transparent panel opposed to the display panel, a side frame which extends along a lateral side of the display panel and is coupled to the transparent panel, a belt which is disposed in the side frame and moves in a longitudinal direction of the side fame, a bar which extends in a direction intersecting the side frame and is moved by the belt, a roller which extends along and adjacent to a lower side of the display panel connected to a lateral side of the display panel and is rotatable, a light-shielding sheet which is fixed at one end thereof to the bar and is coupled at another end thereof to the roller, the light-shielding sheet being wound around or unwound from the roller by movement of the bar, an upper pulley which is positioned at an upper side of the side frame and around which the belt is wound, and a driving pulley which is adjacent to a lower side of the side frame and opposed to the light-shielding sheet, the driving pulley being rotated about an axis of a width direction of the light-shielding sheet and the belt being wound around the driving pulley. The bar includes a piece body around which the light-shielding sheet is wound, and a belt coupler fixed to the belt and rotatably coupled to the piece body.

BRIEF DESCRIPTION OF THE DRA WINGS

The above and other objects, features and other advantages of the present disclosure will be more clearly understood from the following detailed description taken in conjunction with the accompanying drawings, in which:

FIGS. 1 to 34 are views illustrating display devices according to embodiments of the present disclosure.

DETAILED DESCRIPTION OF THE PREFERRED EMBODIMENTS

A description will now be given in detail according to exemplary embodiments disclosed herein, with reference to the accompanying drawings. For the sake of brevity of description with reference to the drawings, the same or equivalent components are denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to facilitate understanding of various technical features, and it should be understood that the embodiments presented herein are not limited by the accompanying drawings. As such, the present disclosure should be construed to extend to any alterations, equivalents and substitutes, in addition to those that are particularly set out in the accompanying drawings.

It is to be understood that, although the terms "first," "second," etc. may be used herein to describe various elements, these elements should not be limited by these terms. These terms are only used to distinguish one element from another.

It will be understood that when an element is referred to as being "connected to" another element, intervening elements may be present. In contrast, it will be understood that when an element is referred to as being "directly connected to" another element, there are no intervening elements present.

A singular representation may include a plural representation unless the context clearly indicates otherwise.

In the present disclosure, it should be understood that the terms "comprises," "includes," "has," etc. specify the presence of features, numbers, steps, operations, elements, components, or combinations thereof described in the specification, but do not preclude the presence or addition of one or more other features, numbers, steps, operations, elements, components, or combinations thereof.

Indication of directions of upward U, downward D, leftward Le, rightward Ri, forward F, and rearward R is merely for convenience of description, and the technical idea disclosed in the present disclosure is not limited thereto.

Referring to FIG. 1, the display device 1 may include a display 10, a side frame 20, and a housing 90. The display 10 may display an image. The side frame 20 may extend along the periphery of the display 10. The housing 90 may be positioned at a lower side of the display 10 and the side frame 20. Alternatively, the housing 90 may be positioned at the upper side, the left side, or the right side of the display 10 and the side frame 20.

The display device 10 may include a first long side LS1, a second long side LS2 opposed to the first long side LS1, a first short side SS1 adjacent to the first long side LS1 and the second long side LS2, and a second short side SS2 opposed to the first short side SS1.

Although each of the first and second long sides LS1 and LS2 is illustrated and described as being longer than each of the first and second short sides SS1 and SS2 for convenience of explanation, the length of each of the first and second long sides LS1 and LS2 may be almost equal to or longer than that of each of the first and second short sides SS1 and SS2.

A direction parallel to the first and second long sides LS1 and LS2 of the display device 10 may be referred to as a lateral direction. A direction parallel to the first and second short sides SS1 and SS2 of the display device 10 may be referred to as a vertical direction. A direction perpendicular to the first and second long sides LS1 and LS2 and the first and second short sides SS1 and SS2 of the display device 10 may be referred to as a forward/backward direction.

Figure 4:
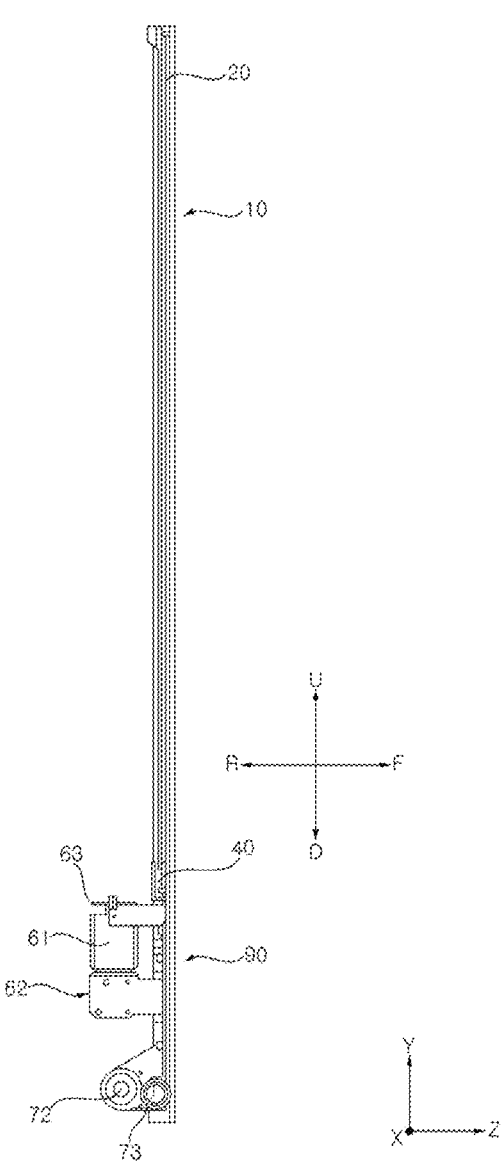

A direction in which the display 10 displays an image may be referred to as a forward F or z (see FIG. 4), and the opposite direction may be referred to as a rearward R or –z (see FIG. 4). The first short side SS1 may be referred to as a left side Le or x. The second short side SS2 may be referred to as a right side Ri or –x. The first long side LS1 may be referred to as an upper side U or y. The second long side LS2 may be referred to as a lower side D or –y.

Hereinafter, a display panel, which is composed of, for example, an organic light emitting diode (OLED), will be described. However, the display panel applicable to the present disclosure is not limited thereto.

Figure 2:
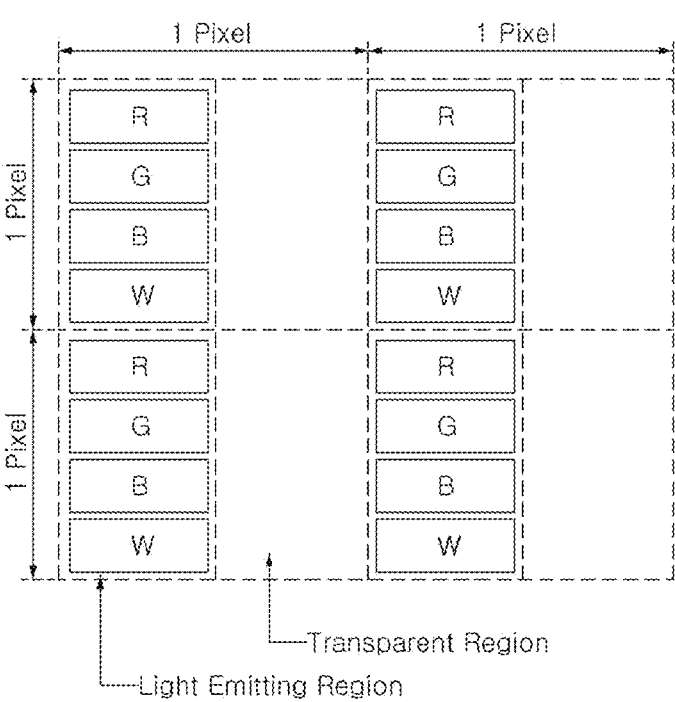

Referring to FIG. 2, a pixel may include a light emitting region and a transparent region. Subpixels of R, G, B and W (Red, Green, Blue and White) may be vertically arranged in the light emitting region, and the transparent region including no subpixel may be disposed adjacent to the light emitting region.

Consequently, the display panel 11 (see FIG. 7) including a plurality of pixels is capable not only of displaying an image but also of allowing light to be transmitted therethrough. The display panel 11 (see FIG. 7) may be referred to as a transparent display panel or a transparent OLED panel.

Figure 3:
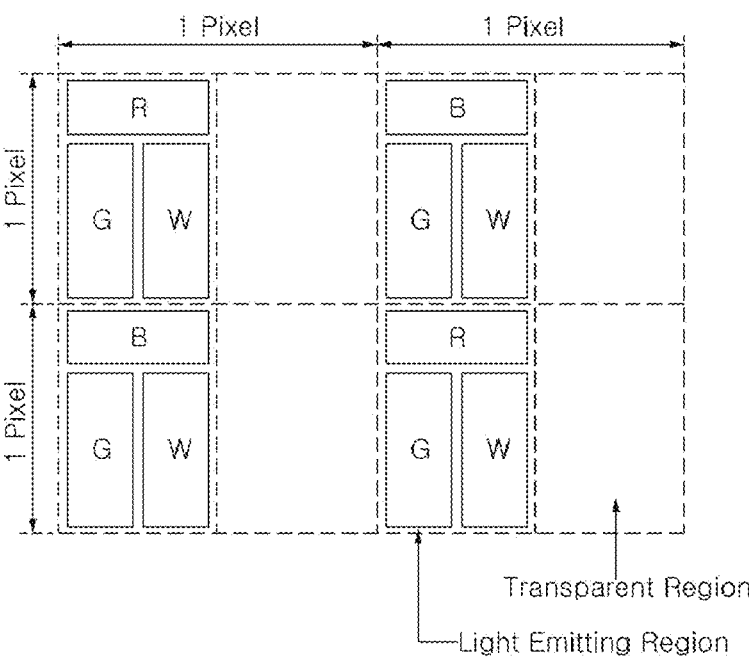

Referring to FIG. 3, a pixel may include a light emitting region and a transparent region. Subpixels of R, G and W (Red, Green and White) or B, G and W (Blue, Green and White) may be disposed adjacent to one another, and the transparent region including no subpixel may be disposed adjacent to the light emitting region.

Consequently, the display panel 11 (see FIG. 7) is capable not only of displaying an image but also of allowing light to be transmitted therethrough. The display panel 11 (see FIG. 7) may be referred to as a transparent display panel or a transparent OLED panel.

Figure 5:
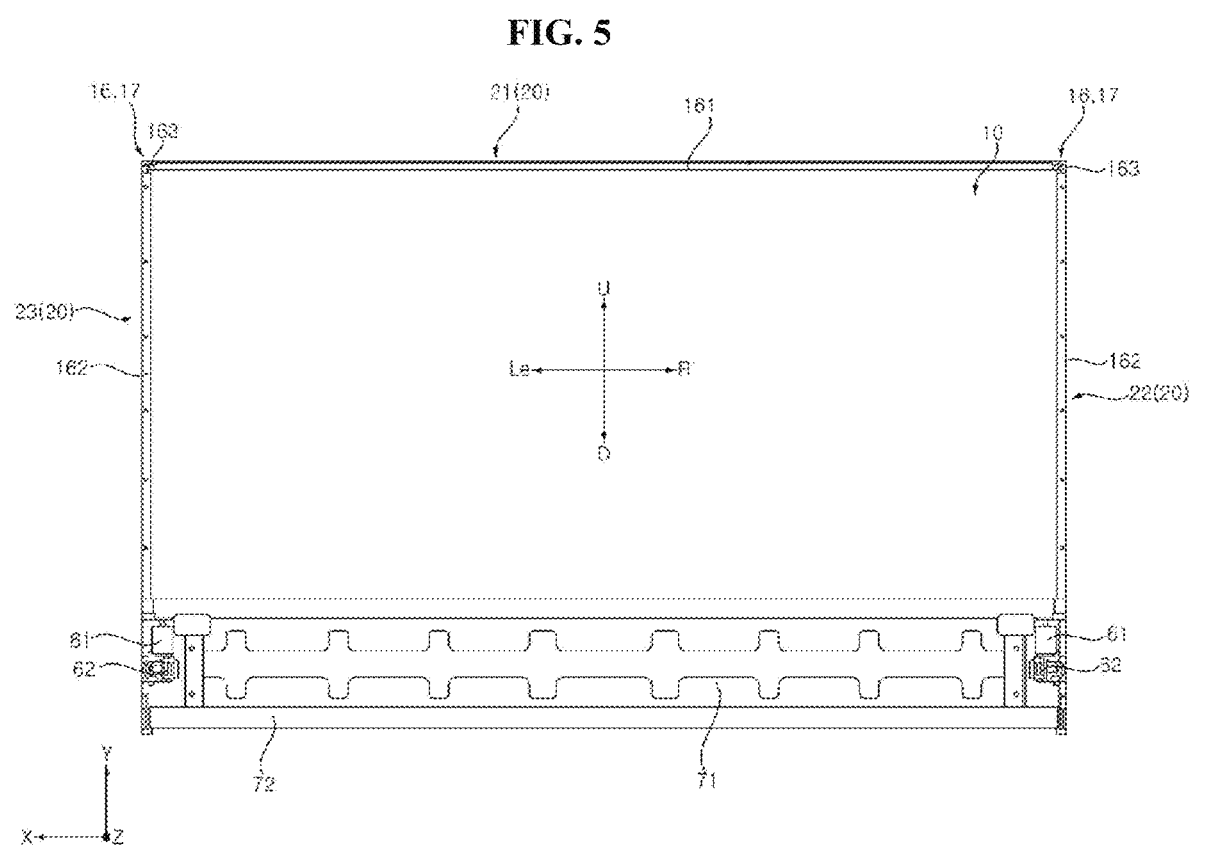

Referring to FIGS. 4 and 5, the display 10 may be coupled to the side frame 20. A housing frame 71 may be coupled or fixed to the side frame 20. The housing frame 71 may cover the rear surface of the display 10. The housing frame 71 may be positioned in the rear of the display 10. The housing frame 71 may be referred to as a rear frame 71, a rear plate 71, or a rear base 71. The length of the housing frame 71 may correspond to the length of the long side of the display 10. The width of the housing frame 71 may be less than the length of the short side of the display 10.

A motor 61 may include a plurality of motors. Each of the plurality of motors 61 may be disposed in the rear of the display 10 adjacent to the left side and the right side of the display 10. A pair of motors 61 may provide dual driving force. A plurality of gear boxes 62 may correspond to the plurality of motors 61, respectively. Each of the plurality of gear boxes 61 may be connected to a corresponding one of the plurality of motors 61. The pair of gear boxes 62 may transmit the dual driving force supplied from the pair of motors 61. The motors 61 and/or the gear boxes 62 may be coupled or fixed to the rear surface of the housing frame 71. The motors 61 and/or the gear boxes 62 may not be exposed to the front outside of the display device 10 by virtue of the housing frame 71. A bar 40 may move vertically on the side frame 20 in a sliding manner.

Figure 6:
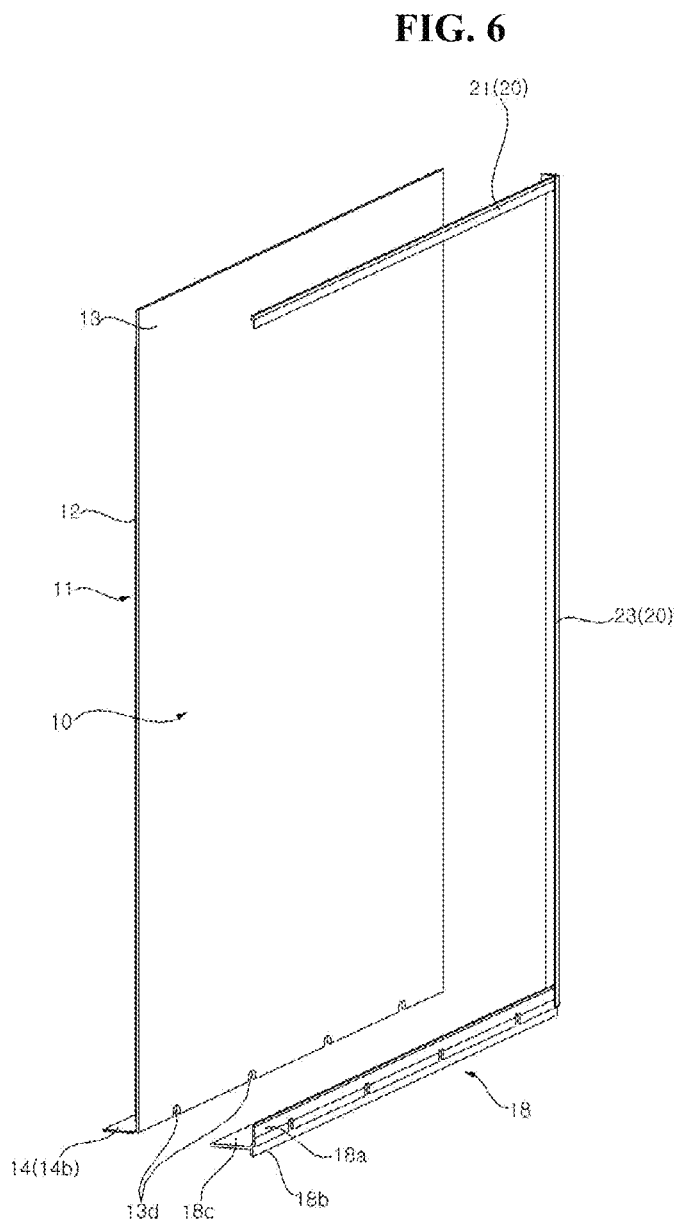

Referring to FIG. 6 in conjunction with FIG. 5, the display 10 may be coupled to the side frame 20. A lower frame 18 may be coupled or fixed to the side frame 20, and may be positioned below the display 10 so as to support the display 10. The side frame 20 may include a first part 21, a second part 22, and a third part 23.

The first part 21 may be coupled to the upper side of the display 10, the second part 22 may be coupled to the right side of the display 10, and the third part 23 may be coupled to the left side of the display 10. The lower frame 18 may be coupled or fixed to the second part 22 and/or the third part 23 of the side frame 20.

Each of vertical fixers 162 may be coupled to a corresponding one of the second part 22 and the third part 23, and a horizontal fixer 161 may be coupled to the first part 21. A corner fixer 16 and a pulley 17 may be coupled to the horizontal fixer 161 and/or the vertical fixer 162 at an upper corner.

Figure 7:
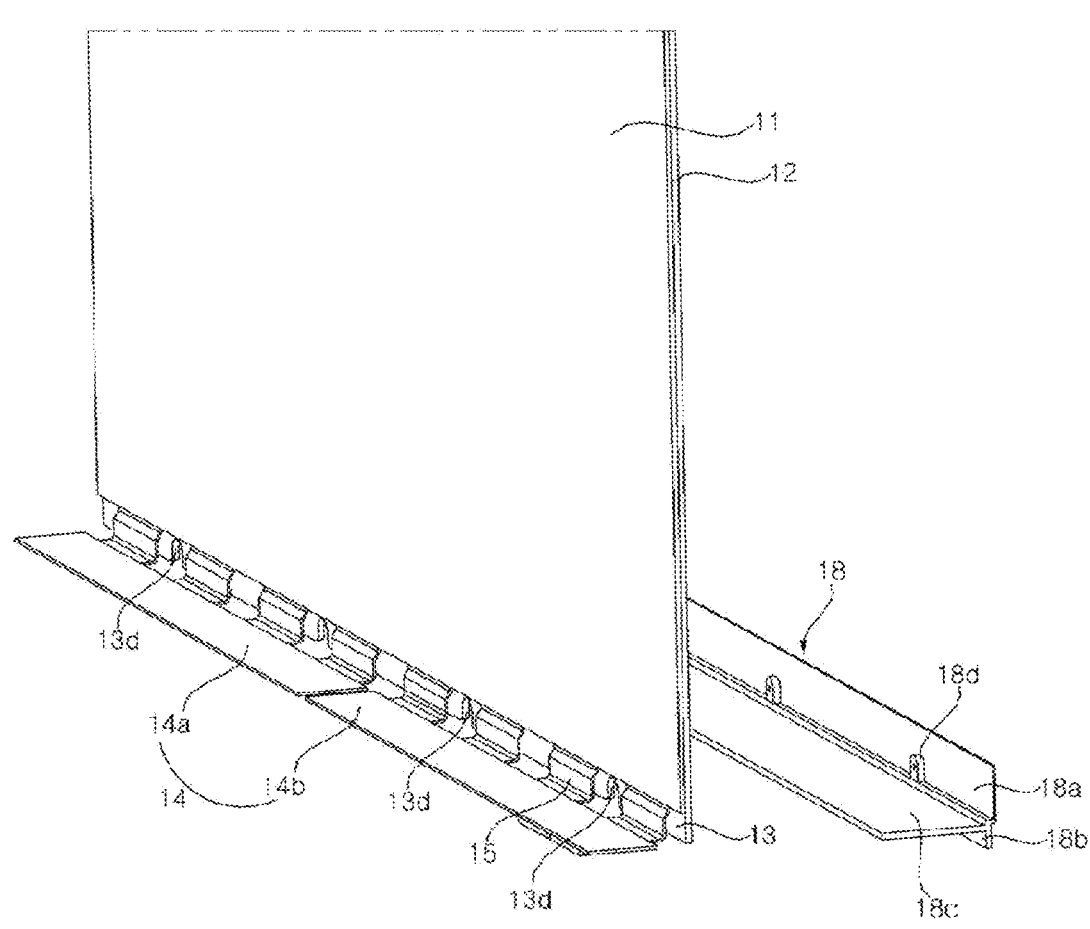

Referring to FIG. 7 in conjunction with FIG. 6, the display panel 11 may divide an image into a plurality of pixels, and may control the color, brightness and chroma of each of the pixels, thereby outputting the image. The display panel 11 may be divided into an active area AA, in which an image is displayed, and an inactive area DA, in which an image is not displayed. The display panel 11 may generate light corresponding to red R, green G or blue B in response to a control signal.

A source PCB 14 may be adjacent to the lower side of the display panel 11. The source PCB 14 may extend along the lower side of the display panel 11. The source PCB may be electrically connected to the display panel 11 via a COF (Chip On Film) 15. The source PCB 14 may be electrically connected to a timing controller board (T-CON board) via a cable (not shown) such as an FFC (Flexible Flat Cable).

The transparent panel 13 may be positioned in the front of the display panel 11. The transparent panel 13 may be transparent glass. An adhesive film 12 may be positioned between the display panel 11 and the transparent panel 13, and may be coupled both to the display panel 11 and the transparent panel 13. The adhesive film 12 may be an OCA (Optically Clear Adhesive) film. The transparent panel 13 may be referred to as a front panel 13.

The adhesive film 12 may cover at least a portion of the rear surface of the transparent panel 13. For example, one side of the adhesive film 12 may be positioned closer to the center of the display panel 11 than a corresponding side of the transparent panel 13. The size or area of the adhesive film 12 may be smaller than the size or area of the transparent panel 13. For example, the upper side, the left side, and the right side of the adhesive film 12 may be adjacent to the upper side, the left side, and the right side of the transparent panel 13, respectively, and the lower side of the adhesive film 12 may be spaced upwards apart from the lower side of the transparent panel 13.

The size of the adhesive film 12 may correspond to the size of the display panel 11. For example, the diagonal length of the adhesive film 12 may be substantially equal to the diagonal length of the display panel 11. In another example, the diagonal length of the adhesive film 12 may be greater than the diagonal length of the display panel 11. A portion of the adhesive film 12 may be disposed around the display panel 11 at the outside of the display panel 11. For example, the adhesive film 12 may form a rectangular line around the display panel 11.

The display panel 11, the adhesive film 12, and the transparent panel 13 may be collectively referred to as the display 10.

Figure 8:
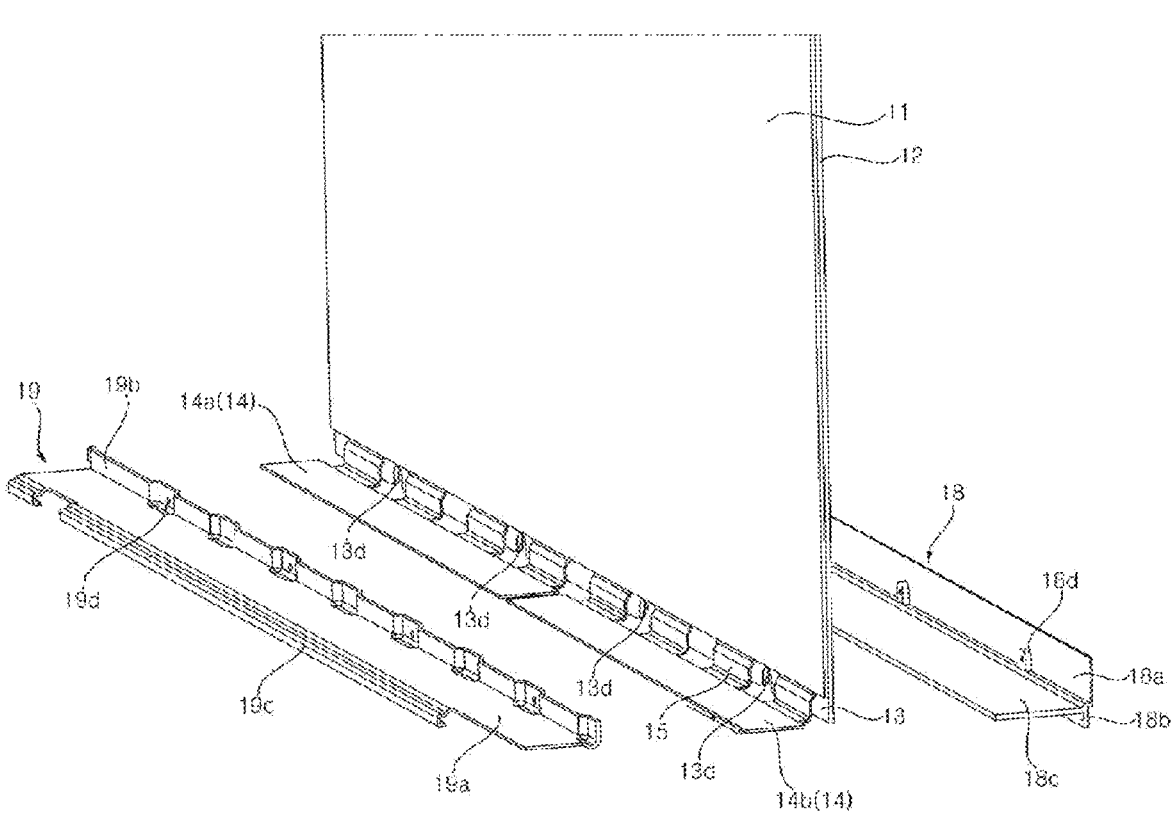

Referring to FIG. 8 in conjunction with FIG. 7, the lower frame 18 may include a horizontal portion 18c, a first vertical portion 18a, a second vertical portion 18b, and a coupling portion 18d. The horizontal portion 18c may be an elongated plate, and the first vertical portion 18a may extend upwards from the front edge of the horizontal portion 18c in a direction perpendicular to the horizontal portion 18c. The second vertical portion 18b may extend downwards from the front edge of the horizontal portion 18c in a direction perpendicular to the horizontal portion 18c. The coupling portion 18d may project from the rear surface of the first vertical portion 18a. The coupling portion 18d may be formed on the upper surface of the horizontal portion 18d and the rear surface of the first vertical portion 18a. The coupling portion 18d may include a plurality of coupling portions which are disposed at regular intervals.

The transparent panel 13 may include a coupling grove 13d which is formed by removing a portion of the transparent panel 13 from the lower side thereof. The coupling groove 13d in the transparent panel 13 may correspond to the coupling portion 18d of the lower frame 18. The coupling portion 18d of the lower frame 18 may be inserted into the coupling groove 13d in the transparent panel 13. The first vertical portion 18a may cover a portion of the front surface of the transparent panel 13 adjacent to the lower side of the transparent panel 13. The horizontal portion of the lower frame 18 may support the transparent panel 13.

The source PCB 14 may be positioned on the horizontal portion 18c of the lower frame 18. The source PCB 14 may face or contact the horizontal portion 18c of the lower frame 18.

Figure 9:
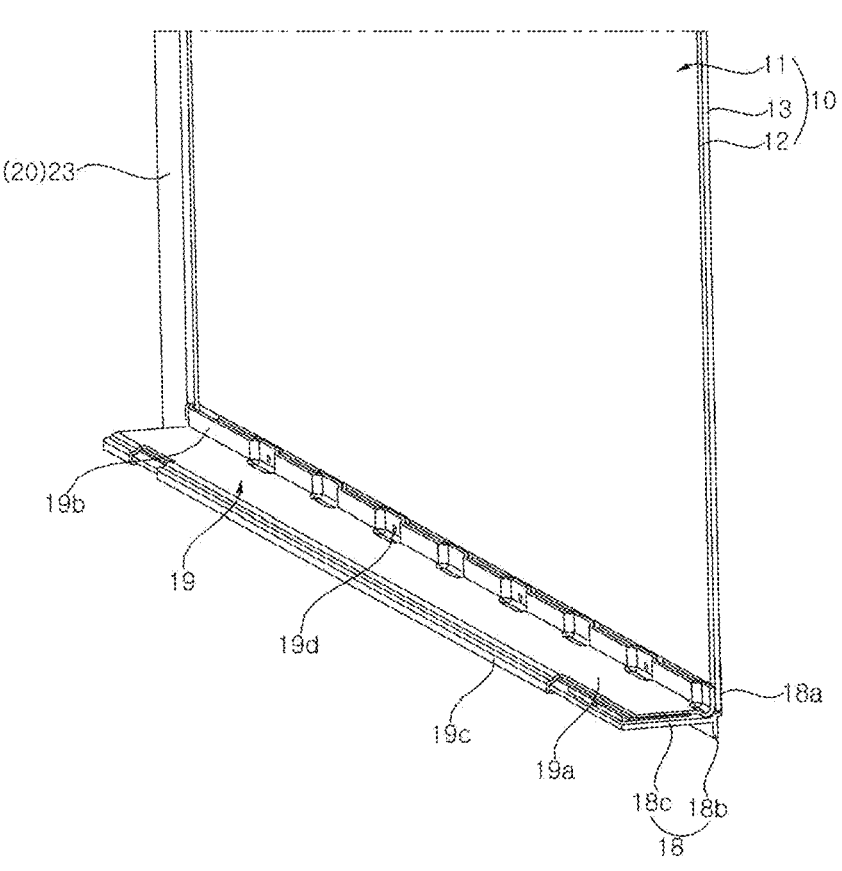

Referring to FIG. 9 in conjunction with FIG. 8, a PCB cover 19 may include a horizontal portion 19a, a folding portion 19c, a vertical portion 19b, and a fixing portion 19d. The horizontal portion 19a may be an elongated plate, and may cover the source PCB 14. The vertical portion 19b may extend upwards from the edge of the horizontal portion 19a or may be bent upwards. The folding portion 19c may be opposed to the vertical portion 19b based on the horizontal portion 19a. The folding portion 19c may be bent toward the lower surface of the horizontal portion 19a and may extend from the horizontal portion 19a. The folding portion 19c may face the horizontal portion 19a. The fixing portion 19d may be formed at the vertical portion 19b. The fixing portion 19d may be formed so as to project forwards from the vertical portion 19b by pressing the vertical portion 19b. The fixing portion 19d may be fixed to the coupling portion 18d of the lower frame 18.

When the folding portion 19c of the PCB cover 19 is coupled to the horizontal portion 18c of the lower frame 18 and the fixing portion 19d of the PCB cover 19 is fixed to the coupling portion 18d of the lower frame 18, the PCB cover 19 may cover the source PCB 14.

Figure 10:
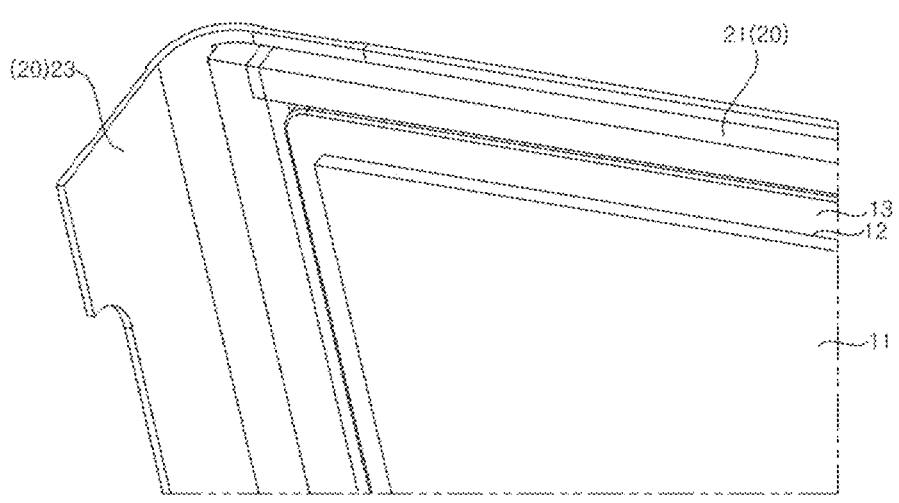
Figure 11:
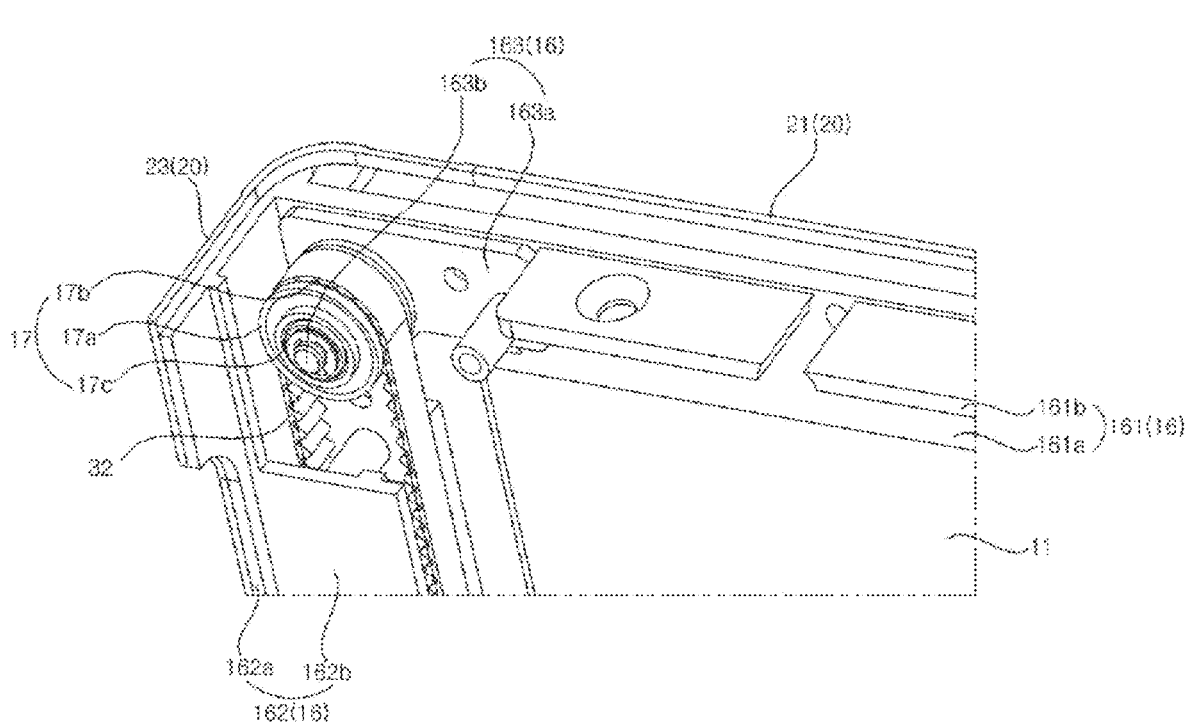

Referring to FIGS. 10 and 11, the display panel 11 may be disposed on the rear surface of the transparent panel 13. The display panel 11 may be adhered or fixed to the adhesive film 12.

The frame fixer 16 may include the horizontal fixer 161, the vertical fixer 162, and the corner fixer 163. The horizontal fixer 161 may be formed integrally with the vertical fixer 162. The horizontal fixer 161 and the vertical fixer 162 may be collectively referred to as an inner frame. The horizontal fixer 161 may include a plate 161a and a wall 161b. The plate 161a extends long laterally, and may be fixed to the first part 21 of the side frame 20. The wall 161b may be formed on the plate 161a. The wall 161b may project backwards from the outer surface of the plate 161a.

The vertical fixer 162 may include a plate 162a and a wall 162b. The plate 162a may extend vertically, and may be fixed to the third part 23 of the side frame 20. The wall 162b may be formed on the plate 162a. The wall 162b may project laterally from the outer surface of the plate 162a.

The corner fixer 163 may be a curved plate segment. The corner fixer 163 may be a plate 163a which is curved along the corner between the vertical fixer 162 and the horizontal fixer 161. A pulley shaft 163b may project toward the rear side of the transparent panel 13 from the outer surface of the plate 163a of the corner fixer 163. The corner fixer 163 may be adhered or fixed to the horizontal fixer 161 and/or the vertical fixer 162. The corner fixer 163 may be referred to as a left corner fixer 163 or a first corner fixer 163. When the corner fixer 163 is positioned at the corner between the first part 21 and the second part 22 of the side frame 20 (see FIG. 5), the corner fixer 163 may be referred to as a right corner fixer 163 or a second corner fixer 163.

The pulley 17 may be fitted over the pulley shaft 163b. The pulley 17 may be rotated about the pulley shaft 163b. The pulley 17 may be referred to as an upper pulley 17. For example, lubricant may be applied between the pulley shaft 163b and the pulley 17 in order to prevent generation of noise. In another example, the pulley 17 may be made of synthetic resin having low frictional resistance, and the pulley shaft 163b may be made of metal, thereby preventing generation of noise and making rotation of the pulley 17 smooth. A belt 32 may be wound around the pulley 17.

The pulley 17 may include a wheel 17a and a belt gear 17b. The wheel 17a may have the shape of a ring or a rim. The pulley shaft 163b may be inserted into the wheel 17a, and the wheel 17a may be rotated about the pulley shaft 163b. The belt gear 17b may form the outer circumferential surface of the wheel 17a. A holding washer 17c may be coupled to the pulley shaft 163b adjacent to the end of the pulley shaft 163b. For example, the holding washer 17c may be an E-ring. The holding washer 17c may prevent the pulley 17 from being separated from the pulley shaft 163b. A first pulley 17 or a left pulley 17 may be positioned at the first corner fixer 163 or the left corner fixer 163, and a second pulley 17 (see FIG. 5) or a right pulley 17 (see FIG. 5) may be positioned at the second corner fixer 163 or a right corner fixer 163.

Figure 12:
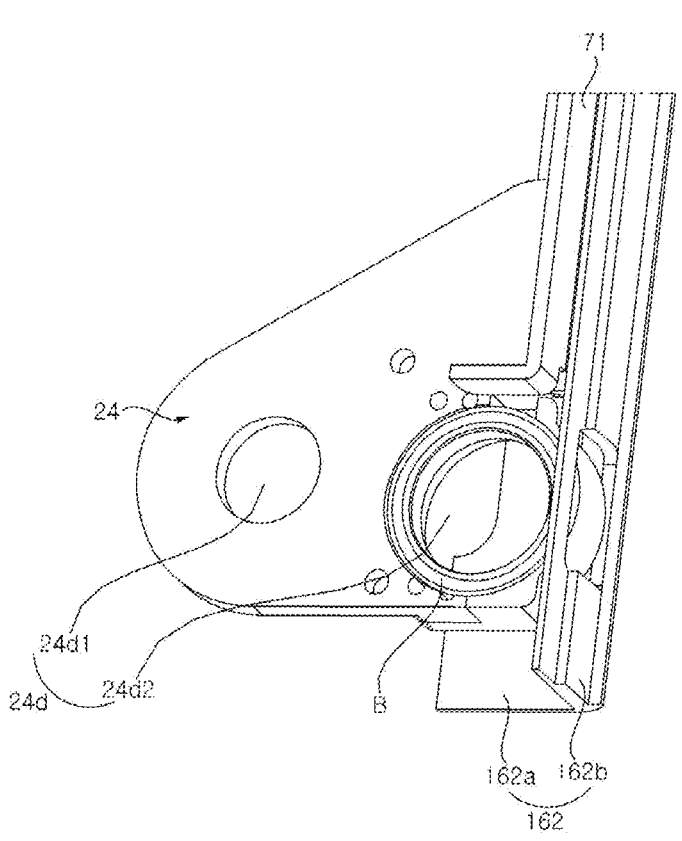
Figure 13:
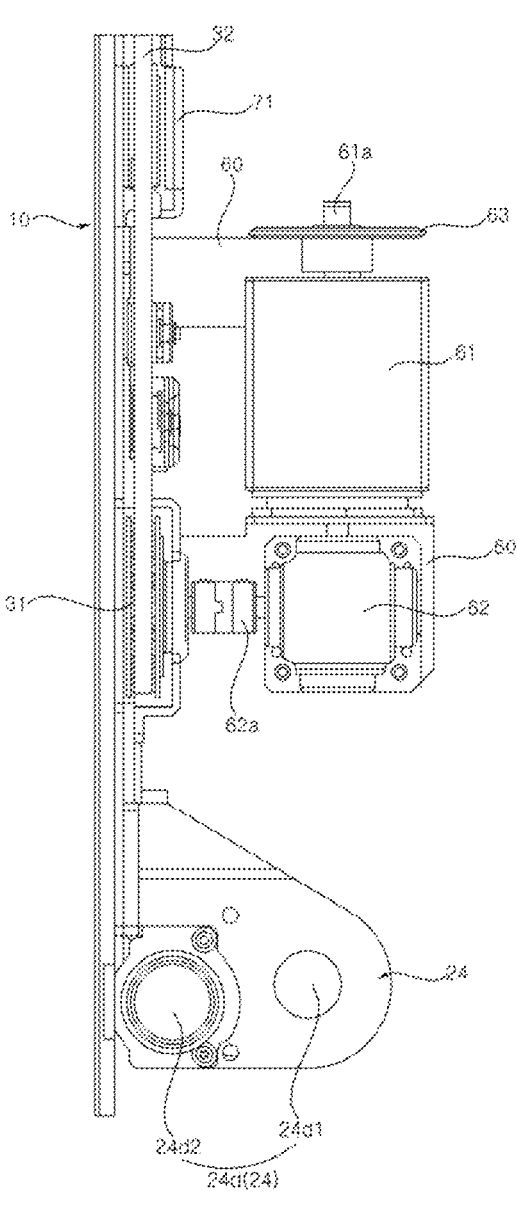

Referring to FIGS. 12 and 13, a mounting bracket 24 may be coupled or fixed to the plate 162a of the vertical fixer 162, and may be supported by the wall 162b of the vertical fixer 162. The mounting bracket 24 may be coupled or fixed to the wall 162b of the vertical fixer 162, and may be supported by the plate 162a of the vertical fixer 162.

The mounting bracket 24 may include a main roller hole 24d1 and a sub-roller hole 24d2. The sub-roller hole 24d2 may face or overlap the plate 162a of the vertical fixer 162. The main roller hole 24d1 may be positioned close to the sub-roller hole 24d2. A bearing B may be mounted in the main roller hole 24d1 and/or the sub-roller hole 24d2.

A fixing bracket 60 may be coupled to the vertical fixer 162 or the housing frame 71. The fixing bracket 60 may be formed integrally with the housing frame 71. The motor 61 and/or the gear box 62 may be coupled to the fixing bracket 60. The motor 61 may provide rotative force, and the gear box 62 may be connected to the motor 61 so as to transmit the rotative force. A rotating counter 63 may be fixed to a motor shaft 61a so as to be rotated therewith.

A joint 62a may be connected to the gear box 62 so as to be rotated by the driving force transmitted from the gear box 62. The axial direction of the joint 62a may be parallel to the width direction of the display 10. A driving pulley 31 may be fixed to the joint 62a so as to be rotated therewith. The belt 32 may be wound around the driving pulley 31. The belt 32 may be referred to as a driving belt 32 or a timing belt 32. The driving pulley 31 may be referred to as a lower pulley 31, a main pulley 31, or a suspending pulley 31.

Figure 14:
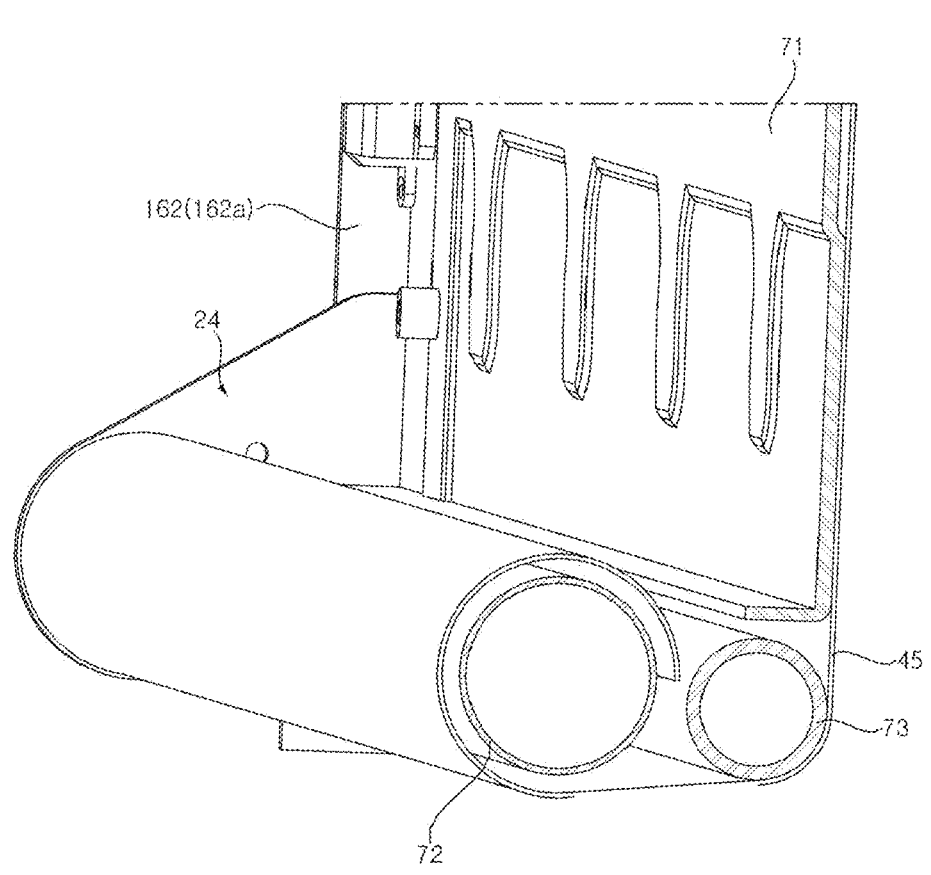
Figure 15:
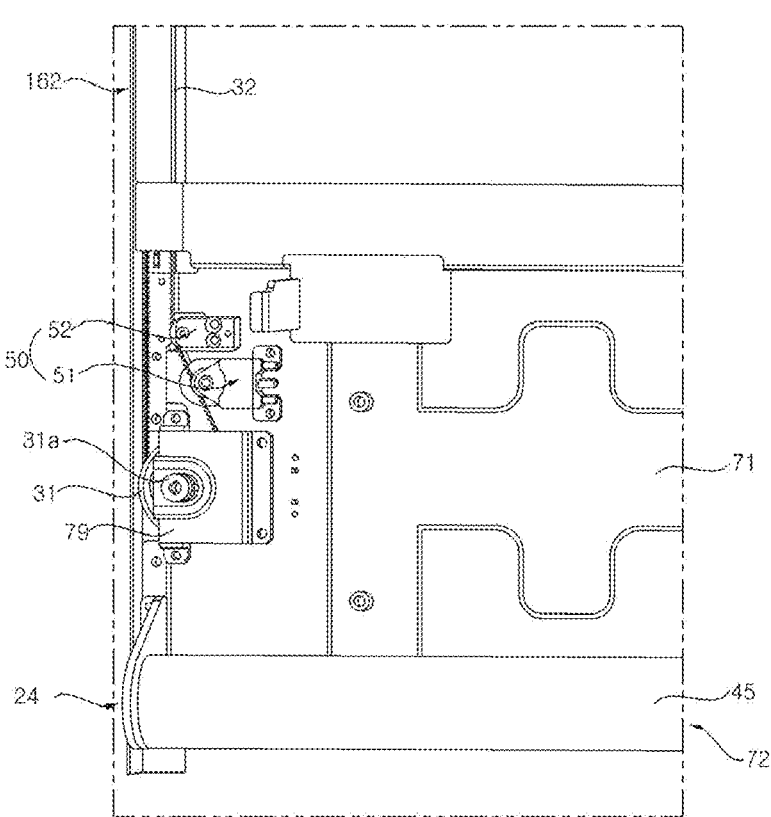

Referring to FIGS. 14 and 15, a main roller 72 may be coupled or inserted into the main roller hole 24d1 (see FIG. 13) in the mounting bracket 24 so as to be rotated therein. A sub-roller 73 may be coupled or inserted into the sub-roller hole 24d2 (see FIG. 13) in the mounting bracket 24 so as to be rotated therein. A light-shielding sheet 45 may be wound around the main roller 72, and may be supported by the sub-roller 73. The light-shielding sheet 45 is referred to as a light-shielding layer 45. The light-shielding sheet 45 may be unwound from the main roller 72, and may be guided by the sub-roller 73 so as to be moved to the front surface of the housing frame 71. The light-shielding sheet 45 unwound from the main roller 72 may cover the front surface of the housing frame 71.

A pulley mount 79 may be coupled to the rear surface of the housing frame 71. The pulley mount 79 may be a bracket or a plate. The pulley mount 79 may be formed integrally with the housing frame 71. The driving pulley 31 may be rotated about the pulley mount 79. The shaft 31a of the driving pulley 31 may be inserted into the pulley mount 79, and may be aligned by the pulley mount 79. For example, the driving pulley 31 is rotatable about the pulley mount 79 but cannot be moved in up-and-down direction or in a lateral direction.

A sub-pulley 50 may be a tensioner 50. The sub-pulley 50 may be positioned above the pulley mount 79, and may push the belt 32. The belt 32 may maintain a certain tension by means of the sub-pulley 50. The sub-pulley 50 may include a plurality of sub-pulleys 51 and 52.

Figure 16:
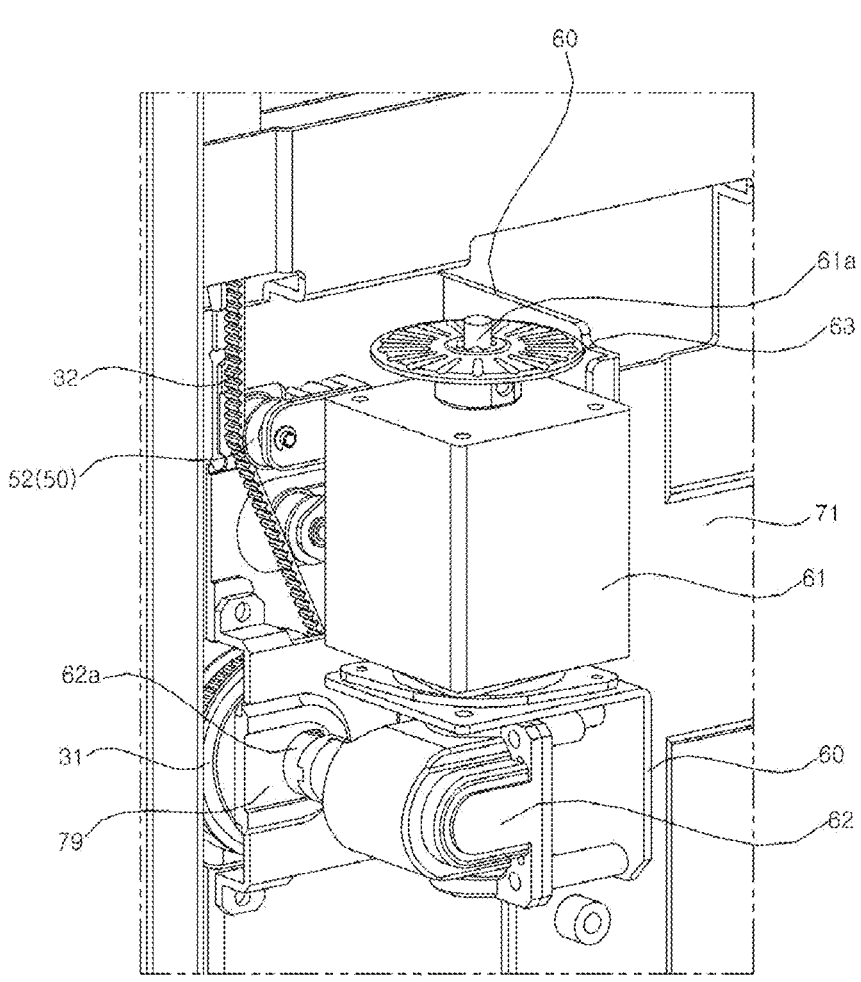
Figure 17:
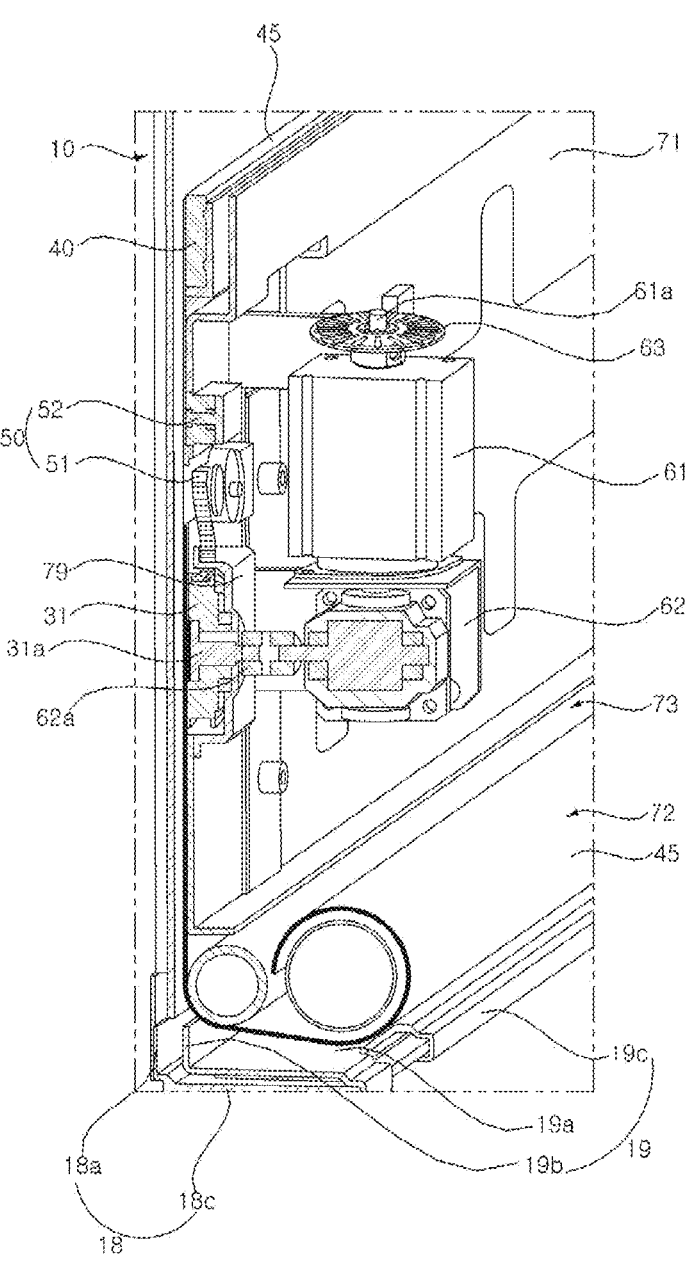

Referring to FIGS. 16 and 17 in conjunction with FIG. 15, the driving force supplied from the motor 61 may be transmitted to the driving pulley 31 via the gear box 62. The driving pulley 31 may be rotated at the pulley mount 79. When the driving pulley 31 is rotated, the belt 32 may be moved in an up-and-down direction, and may maintain certain tension by means of the sub-pulley 50.

The lower frame 18 including the PCB cover 19 coupled thereto may be positioned below the housing frame 71. The main roller 72 and the sub-roller 73 may be positioned above the lower frame 18 in rear of the housing frame 71. The light-shielding sheet 45 may be wound around and unwound from the main roller 72, and may be guided by means of the sub-roller 73 so as to cover the front surface of the housing frame 71.

The end of the light-shielding sheet 45 may be fixed to the bar 40. When the belt 32 fixed to one end of the bar 40 moves, the bar 40 may be moved in an up-and-down direction. As the bar 40 is moved, the light-shielding sheet 45 may cover the rear surface of the display 10. The bar 40 may be positioned in rear of the rear surface of the display 10, and may be moved in an up-and-down direction of the display 10.

Figure 18:
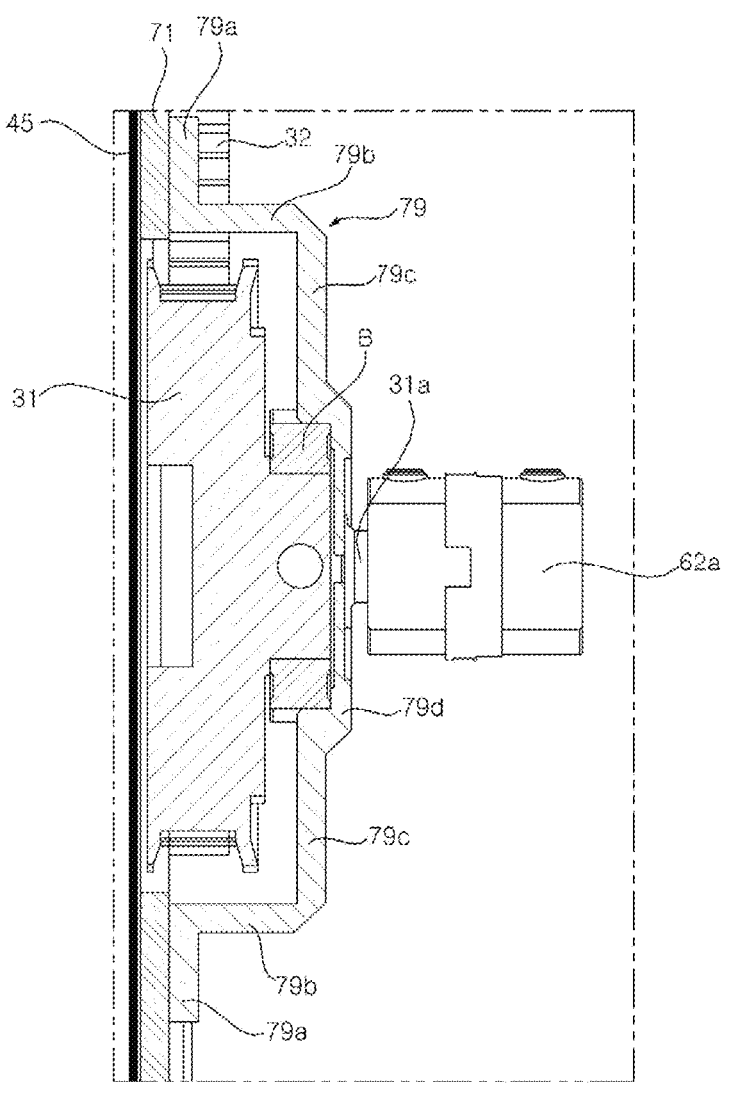
Figure 19:
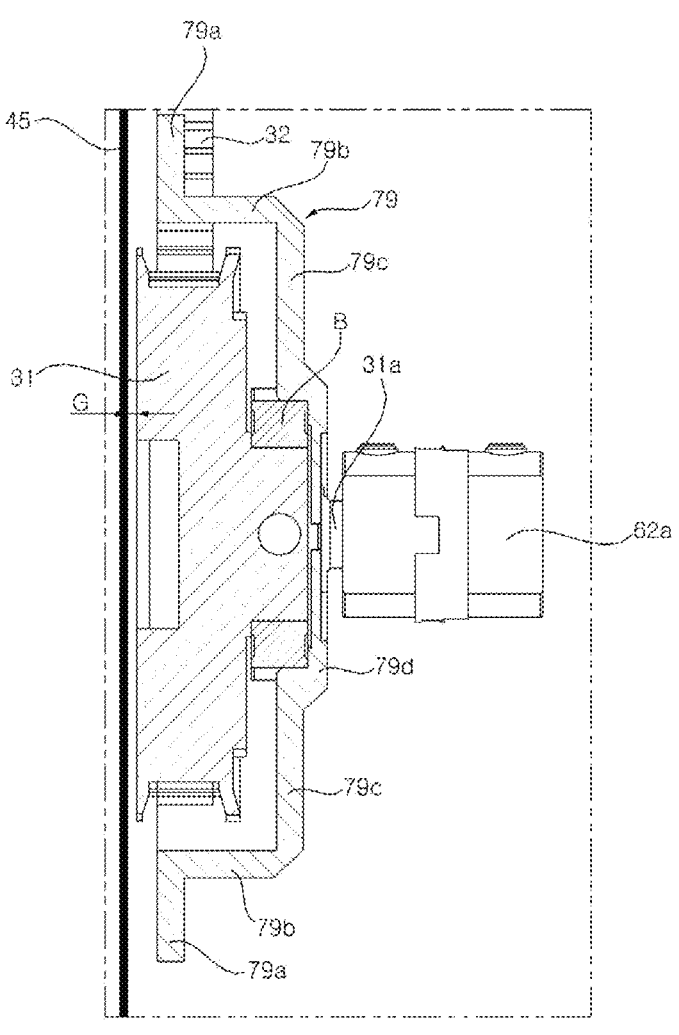

Referring to FIGS. 18 and 19, the pulley mount 70 may include a flange portion 79a, a pulley housing 79b, a bearing mount 79c, and a shaft mount 79d. The flange portion 79a, which has a disc shape, may be fixed to the rear surface of the housing frame 71. The pulley housing 79b may provide a space receiving the driving pulley 31. The diameter of the pulley housing 79b may be larger than the diameter of the driving pulley 31, and the height of the pulley housing 79b may be greater than the thickness of the driving pulley 31.

The bearing B may be fixed to the bearing mount 79c. The pulley shaft 31a may extend to the outside from the inside of the pulley mount 79 through the shaft mount 79d. The driving pulley 31 may be coupled to the bearing B so as to be rotated in the pulley housing 70b. The pulley shaft 31a may be coupled to the joint 62a so as to be rotated therewith.

The front surface of the driving pulley 31 may be spaced apart from the light-shielding sheet 45. A certain gap G may be defined between the front surface of the driving pulley 31 and the rear surface of the light-shielding sheet 45. Consequently, the belt 32 is movable by rotation of the driving pulley 31 without a structure passing through the light-shielding sheet 45.

Figure 20:
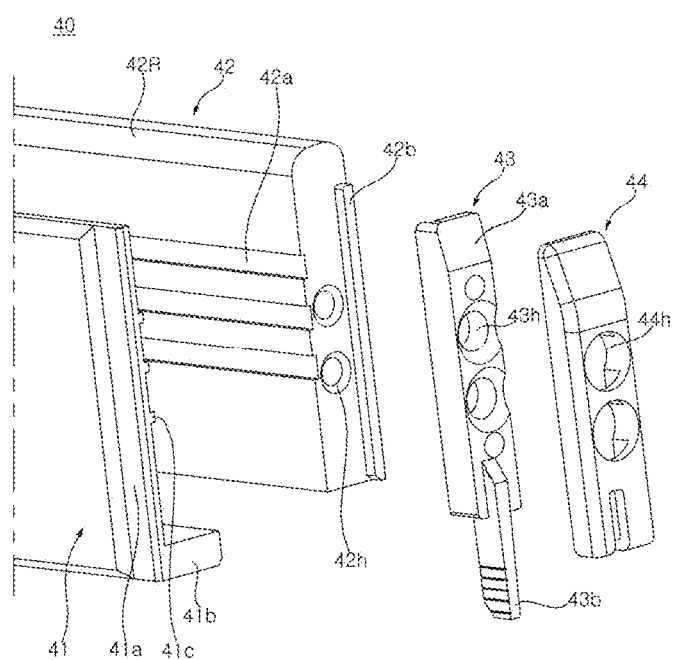

Referring to FIG. 20, the bar 40 may include a first piece 41, a second piece 42, a belt fixer 43, and a fixer cover 44. The first piece 41 may be coupled to the second piece 42. The first piece 41 and the second piece 42 may constitute a piece body.

The first piece 41 may include a first part 41a and a second part 41b. The first part 41a may have the shape of an elongated plate. The second part 41b may extend in the width direction of the first part 41a to form a wall at the edge of the first part 41a. A fixing rib 41c may be formed on one surface of the first part 41a. The fixing rib 41c may also extend in the longitudinal direction of the first part 41a. The fixing rib 41c may include a plurality of fixing ribs. The plurality of fixing ribs 41c may be arranged in the state of being spaced apart from each other by a certain distance.

The second piece 42 may have the shape of a plate which extends to a length corresponding to the first part 41a. A rib groove 42a may be formed in one surface of the second piece 42 so as to extend long in the longitudinal direction of the second piece 42. The rib groove 42a may include a plurality of rib grooves. The plurality of rib grooves 42a may be disposed on one surface of the second piece 42a so as to correspond to the plurality of fixing ribs 41c. A side rib 42b may be formed on the end surface of the second piece 42 in the width direction of the second piece 42. A fastening hole 42h may be formed in the end surface of the second piece 42 adjacent to the side rib 42b. The fastening hole 42h may include a plurality of fastening holes. The edge 42R of the second piece 42 may be rounded in the longitudinal direction of the second piece 42.

The belt fixer 43 may be coupled the end surfaces of the first piece 41 and the second piece 42. The belt fixer 43 may be referred to as a belt cover 43. The belt fixer 43 may have a fastening hole 43h. The fastening hole 43h in the belt fixer 43 may correspond to the fastening hole 42h in the second piece 42. The fastening hole 43h may include a plurality of fastening holes.

The fixer cover 44 may be coupled to the belt fixer 43. The fixer cover 44 may include an insert hole 44h. The insert hole 44h may correspond to the fastening hole 43h in the belt fixer 43. The insert hole 44h may include a plurality of insert holes.

Figure 21:
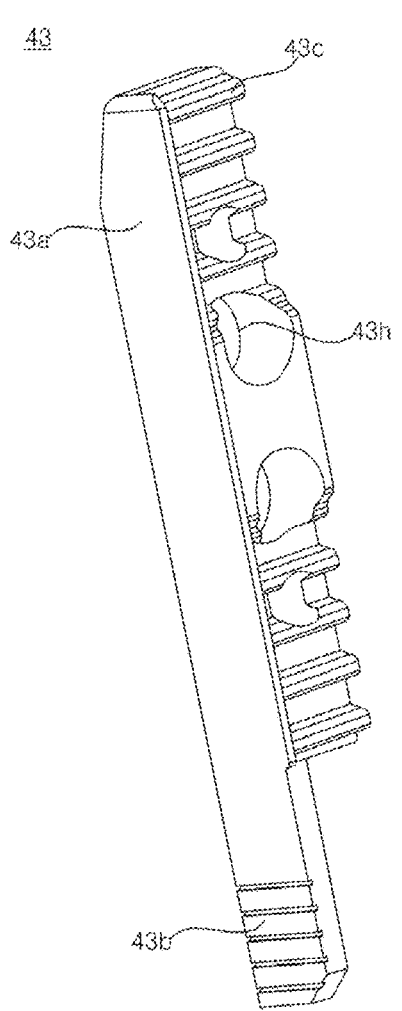
Figure 22:
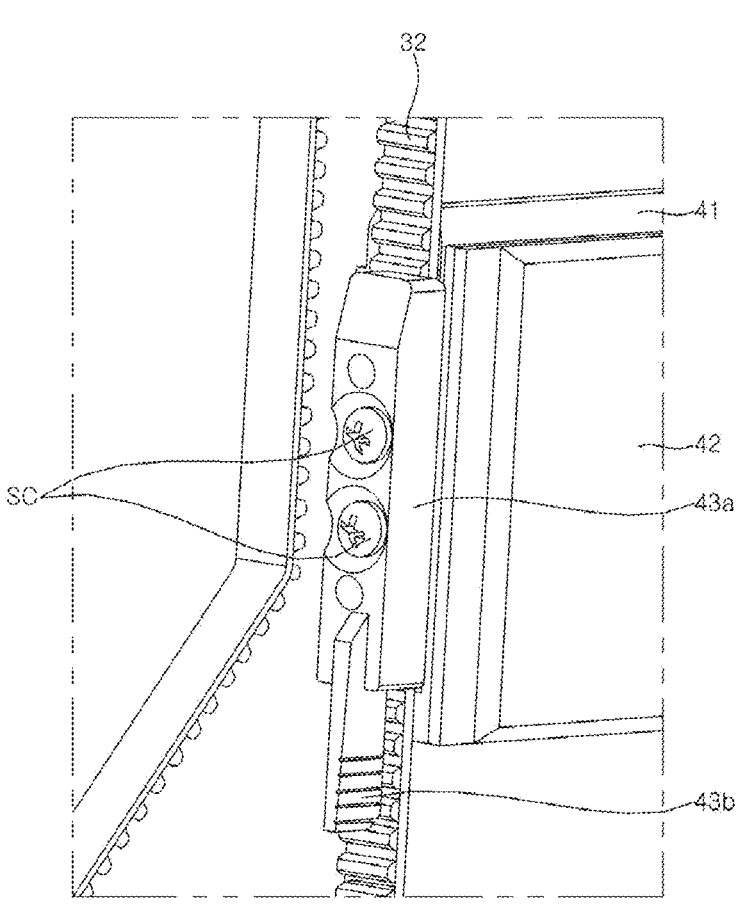

Referring to FIGS. 21 and 22, the belt fixer 43 may include a fixer body 43a and a fixer tail 43b. The fixer body 43a may extend long, and may have the fastening hole 43h. A gear surface 43c may be formed on one surface of the fixer body 43a. The fixer tail 43b may extend long from one end of the fixer body 43a in the longitudinal direction of the fixer body 43a. The fixer tail 43b may be an indicator for the position of the bar 40 (see FIG. 2).

The belt fixer 43 may be coupled to one end surface of the bar 40 while pushing the belt 32. The gear of the belt 32 and the gear surface 43c of the belt fixer 43 may be engaged with each other. The belt fixer 43 may be fixed to one end surface of the bar 40 (see FIG. 20) by inserting a screw SC into the fastening hole 43h. Accordingly, it is possible to prevent slipping of the belt 32 and to make upward/downward movement of the bar 40 (see FIG. 20) precise.

Figure 23:
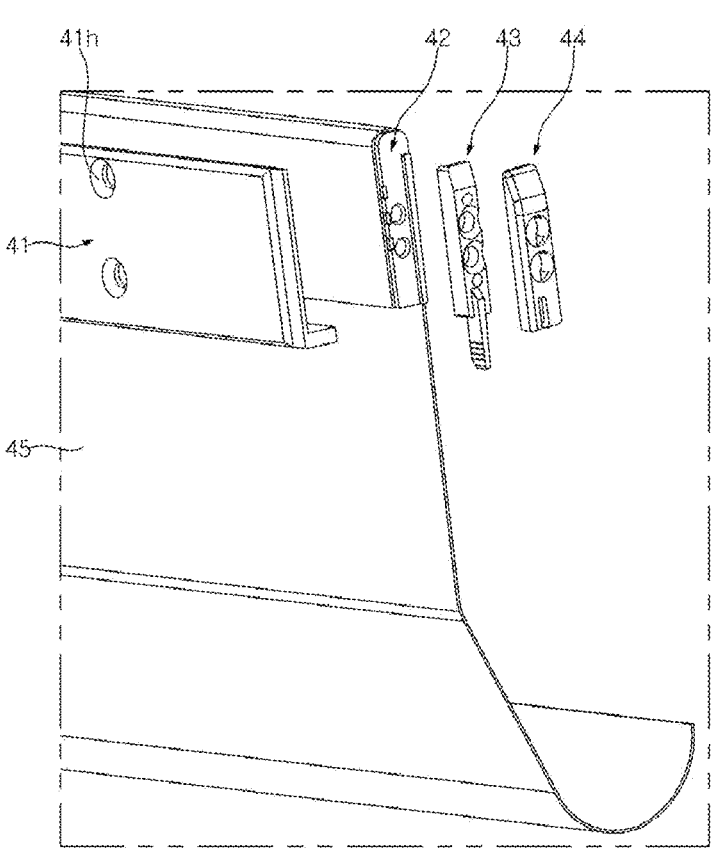
Figure 24:
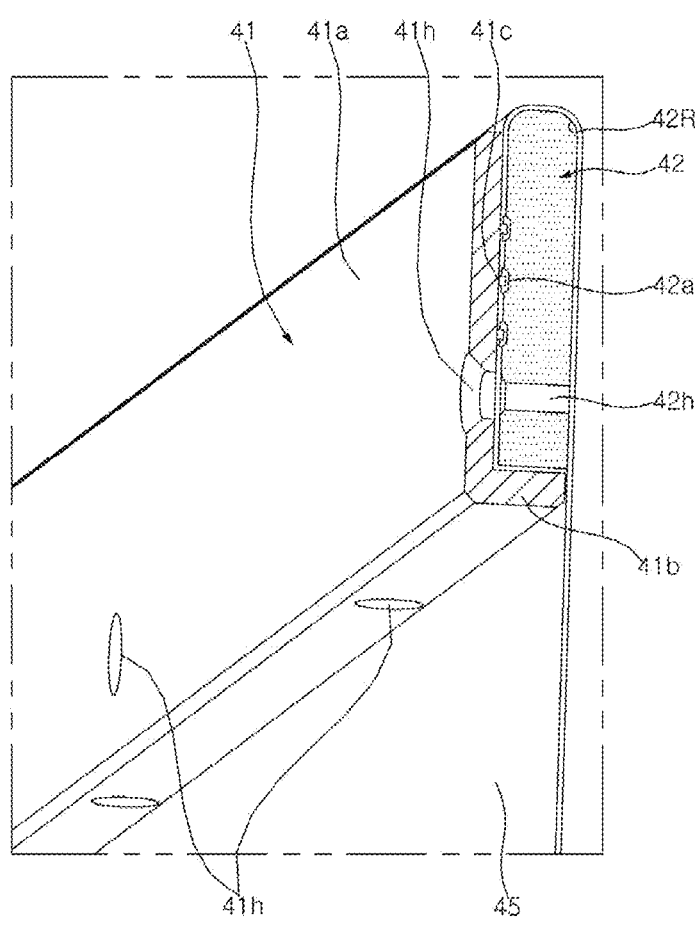

Referring to FIGS. 23 and 24, the light-shielding sheet 45 may be wound around the bar 40. The light-shielding sheet 45 may cover the outer surface of the second piece 42, and may be inserted between the first piece 41 and the second piece 42 in the state of being wound around the rounded edge 42R. The light-shielding sheet 45 may be in contact both with the first piece 41 and with the second piece 42. The light-shielding sheet 45 may be positioned between the fixing rib 41c and the rib groove 42a. The fixing rib 41c may be inserted into the rib groove 42a so as to catch the light-shielding sheet 45. The light-shielding sheet 45 may be wound around the rounded edge 42R of the second piece 42, thereby providing the light-shielding sheet 45 with a high tension.

The end of the light-shielding sheet 45 may be positioned between the first part 41a of the first piece 41 and the second piece 42. The end of the light-shielding sheet 45 may also be positioned between the second part 42b of the first piece 41 and the second piece 42. When the end of the light-shielding sheet 45 is positioned between the second part 41b of the first piece 41 and the second piece 42, the light-shielding sheet 45 may be further firmly fixed to the bar 40.

Figure 25:
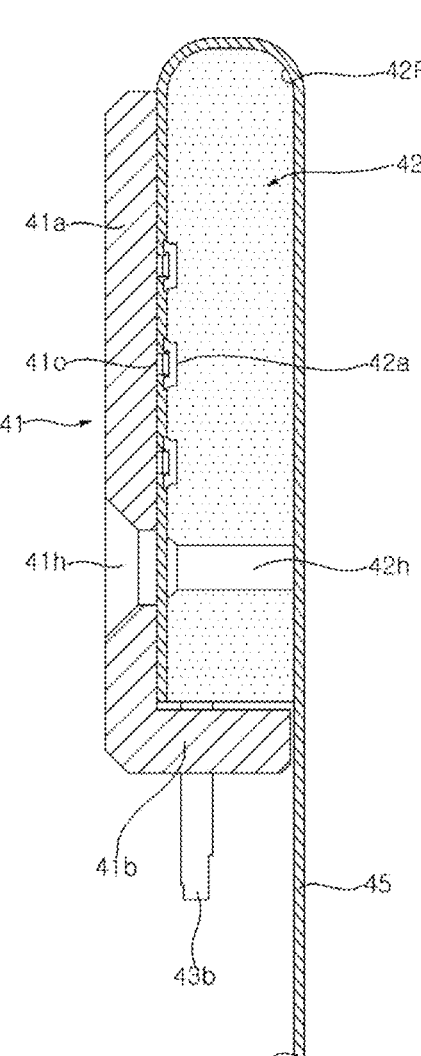

Referring to FIG. 25 in conjunction with FIG. 24, the second piece 42 may have a horizontal fastening hole 42h. The horizontal fastening hole 42h may be formed through the second piece 42 in the width direction of the second piece 42. The first part 41a of the first piece 41 may have a horizontal fastening hole 41h. The horizontal fastening hole 41h in the first piece 41 may correspond to the horizontal fastening hole 42h in the second piece 42. A screw may be inserted into the horizontal fastening hole 42h in the second piece 42 through the horizontal fastening hole 41h in the first piece 41 and may be fixed thereto. Here, the screw may pass through the light-shielding sheet 45. When the screw passes through the light-shielding sheet 45, wrinkles may be generated at the light-shielding sheet 45. However, because the fixing rib 41c is inserted into the rib groove 42a, it is possible to prevent generation of wrinkles at the light-shielding sheet 45.

Consequently, it is possible to firmly fix the light-shielding sheet 45 to the bar 40 to provide the light-shielding sheet 45 with sufficient tension and to prevent generation of wrinkles.

Figure 26:
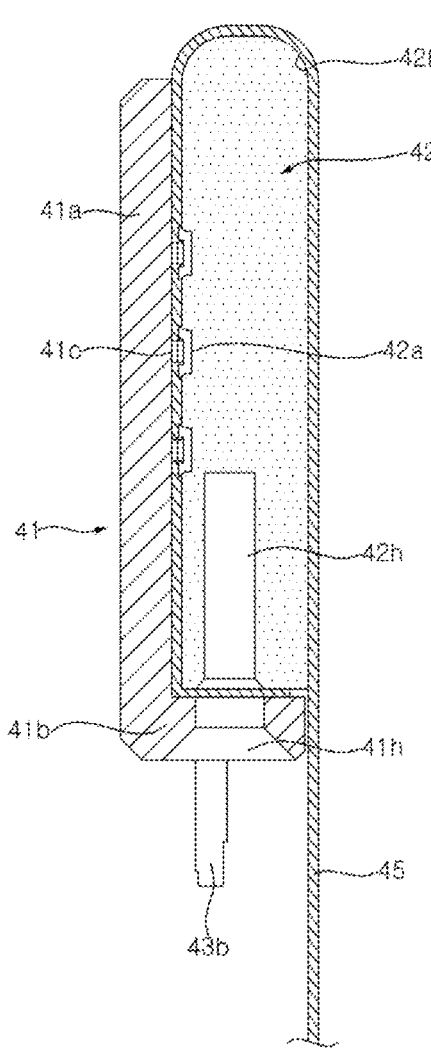

Referring to FIG. 26 in conjunction with FIG. 24, the second piece 42 may have a vertical fastening hole 42h. The vertical fastening hole 42h may be formed in the second piece 42 in the width direction of the second piece 42. The second part 42b of the first piece 41 may have a vertical fastening hole 41h. The vertical fastening hole 41h in the first piece 41 may correspond to the vertical fastening hole 42h in the second piece 42. A screw may be inserted into the vertical fastening hole 42h in the second piece 42 through the vertical fastening hole 41h in the first piece 41 and may be fixed thereto. Here, the screw may pass through the light-shielding sheet 45. When the screw passes through the light-shielding sheet 45, wrinkles may be generated at the light-shielding sheet 45. However, because the fixing rib 41c is inserted into the rib groove 42a, it is possible to prevent generation of wrinkles at the light-shielding sheet 45.

Consequently, it is possible to firmly fix the light-shielding sheet 45 to the bar 40 to provide the light-shielding sheet 45 with sufficient tension and to prevent generation of wrinkles.

Figure 27:
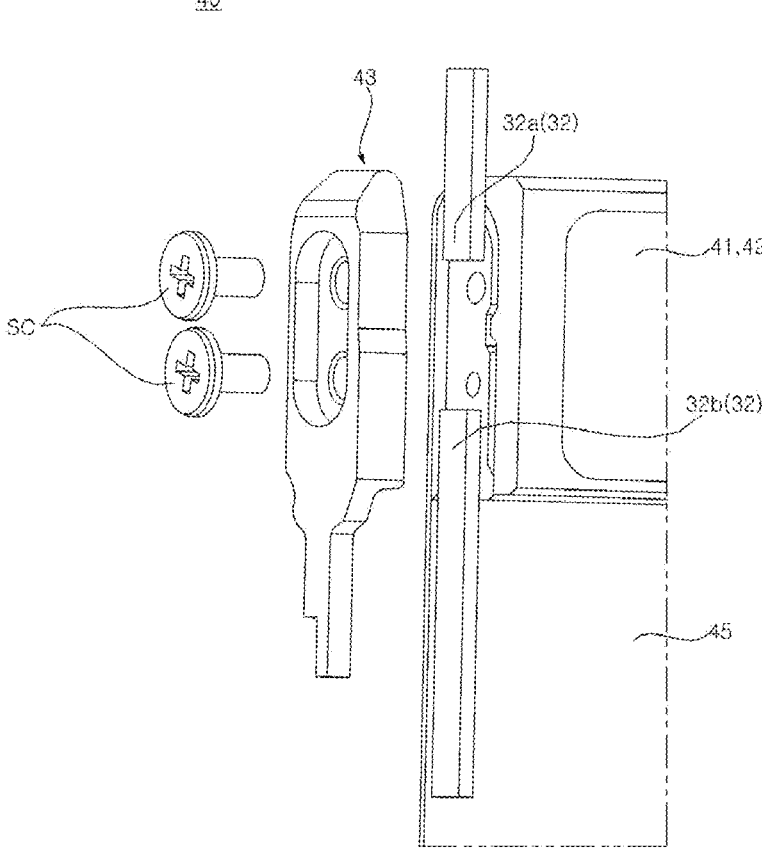
Figure 28:
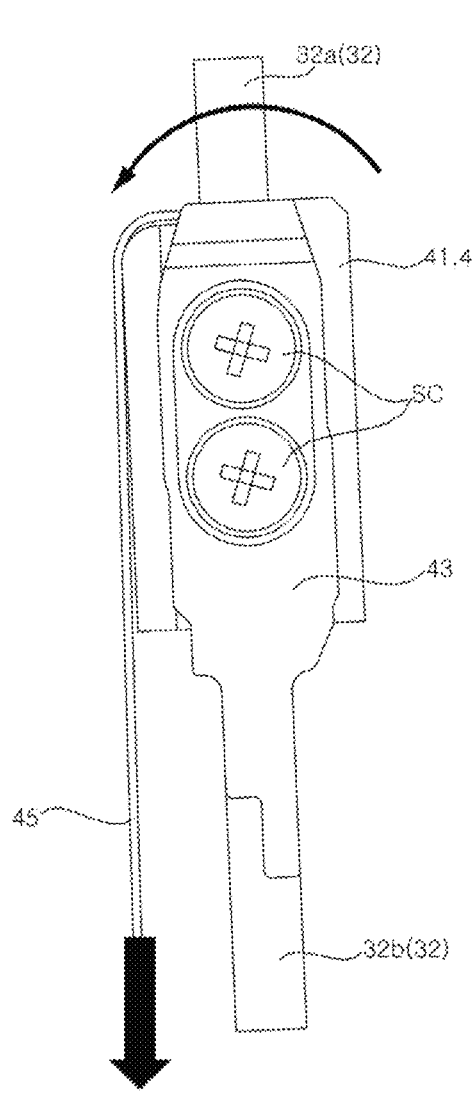

Referring to FIGS. 27 and 28, the belt 32 may be a linear belt including two ends 32a and 32b. The upper end 32a of the belt 32 may be coupled or fixed to the upper side of each of two lateral surfaces of the piece body 41 and 42 with the light-shielding sheet 45 wound therearound and coupled thereto. The lower end 32b of the belt 32 may be coupled or fixed to the lower side of each of two lateral surfaces of the piece body 41 and 42. The belt fixer 43 may be coupled or fixed to the piece body 41 and 42 while fixing the two ends 32a and 32b of the belt 32 to the two lateral surfaces of the piece body 41 and 42. The belt fixer 43 may be coupled or fixed to the piece body 41 and 42 by means of the fastening member SC. The belt fixer 43 may fix the belt 32 to the piece body 41 and 42 in order to prevent the belt 32 from finely moving on the piece body 41 and 42.

When the light-shielding sheet 45 pulls the piece body 41 and 42 of the bar 40, the piece body 41 and 42 may be rotated about the longitudinal axis of the piece body 41 and 42. When the piece body 41 and 42 and the belt fixer 43 are rotated, the belt may be misaligned with the vertical direction. When the belt 32 is inclined with respect to the vertical direction, the belt 32 may be locally worn away due to friction with the pulley 17 and/or the driving pulley 31, and noise may be generated during operation of the belt 32.

Figure 29:
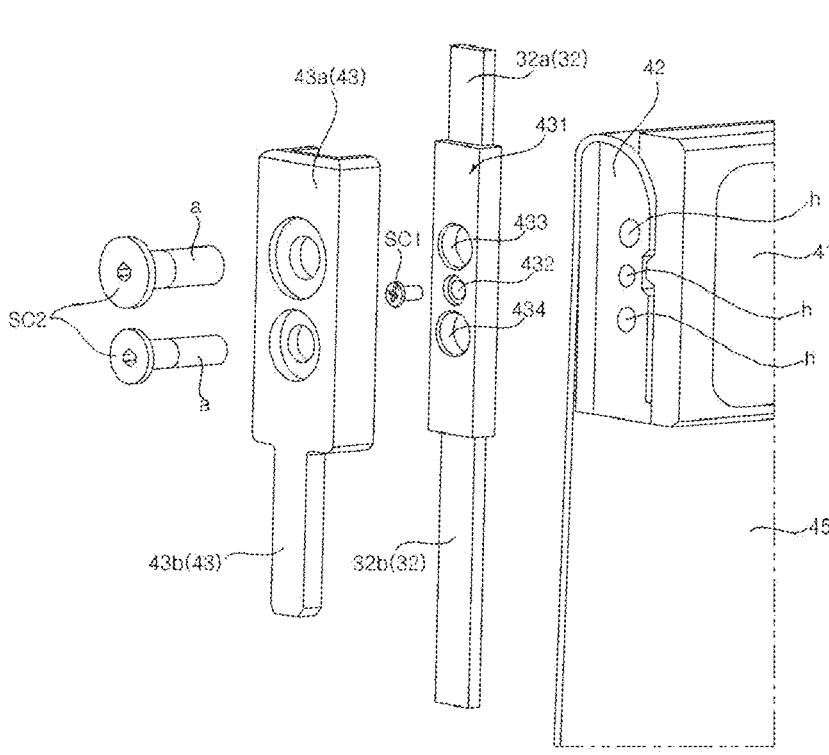
Figure 30:
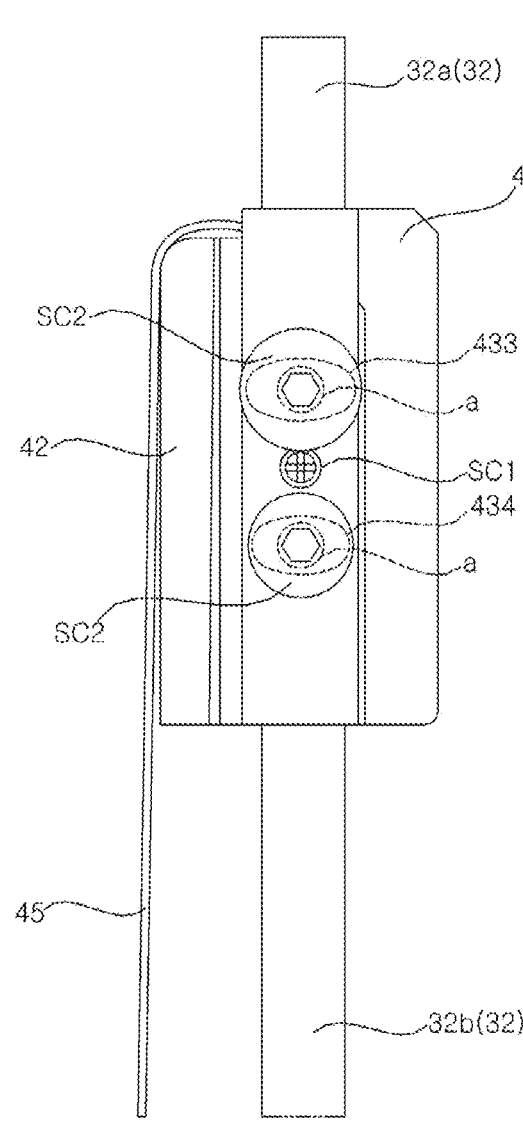

Referring to FIGS. 29 and 30, a belt coupler 431 may connect the two ends 32a and 32b of the belt 32 to each other. The belt coupler 431 may be coupled to the piece body 41 and 42. For example, the belt coupler 431 may be coupled to the second piece 42.

The belt coupler 431 may extend long. The longitudinal direction of the belt coupler 431 may be aligned with the longitudinal direction of the belt 32. The belt coupler 431 may be formed integrally with the belt 32. The belt coupler 431 may have a center hole 431 and side holes 433 and 434. The center hole 432 may be referred to as a rotational center hole 432 or a rotational center portion 432. The side holes 433 and 434 may be referred to as play holes 433 and 434 or play portions 433 and 434.

A center fastening member SC1 may be inserted into the center hole 432 in the belt coupler 431, and may then be coupled or fixed to the fastening hole h in the piece body 41 and 42. The belt coupler 431 may be rotated about the center coupling member SC1. The center fastening member SC1 may be referred to as a main fastening member SC1, a first fastening member SC1, or a rotating shaft SC1.

Side fastening members SC2 may be inserted into the side holes 433 and 434, and may then be coupled or fixed to the fastening hole h in the piece body 41 and 42. The side fastening members SC2 may include respective shafts a, which are inserted into the side holes 433 and 434 and the fastening holes h in the piece body 41 and 42.

The diameter of each of the side holes 433 and 434 may be larger than the diameter of the shaft a of a corresponding one of the side fastening members SC2. For example, each of the side holes 433 and 434 may be an elongate hole. When each of the side holes 433 and 434 is an elongate hole, the length of the long axis of the elongate hole may be greater than the outside diameter of the shaft a of each of the fastening members SC2, and the length of the short axis of the elongate hole may be equal to or slightly greater than the outside diameter of each of the fastening members SC2. The shafts a of the side fastening members SC2 are movable in respective side holes 433 and 434. The side holes 433 and 434 are movable with respect to respective fastening members SC2.

The belt coupler 431 is rotatable about the center fastening member SC1, and the side fastening members SC2 and the side holes 433 and 434 may allow the belt coupler 431 to be slightly rotated and restrict the rotational range of the belt coupler 431.

Figure 31:
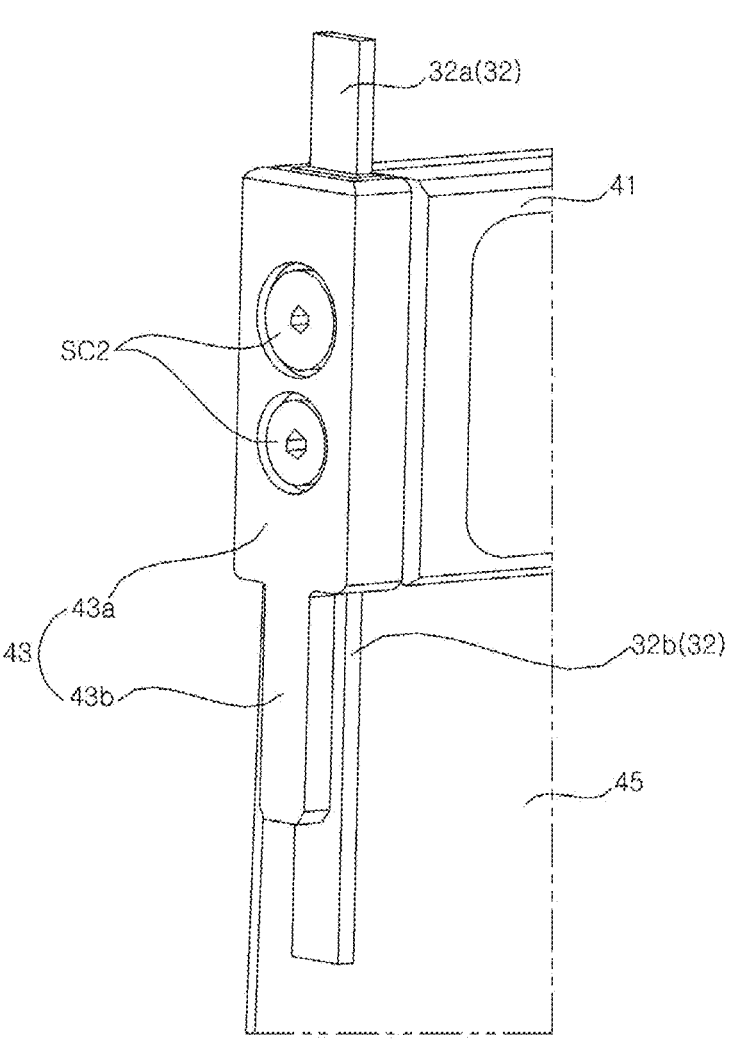
Figure 32:
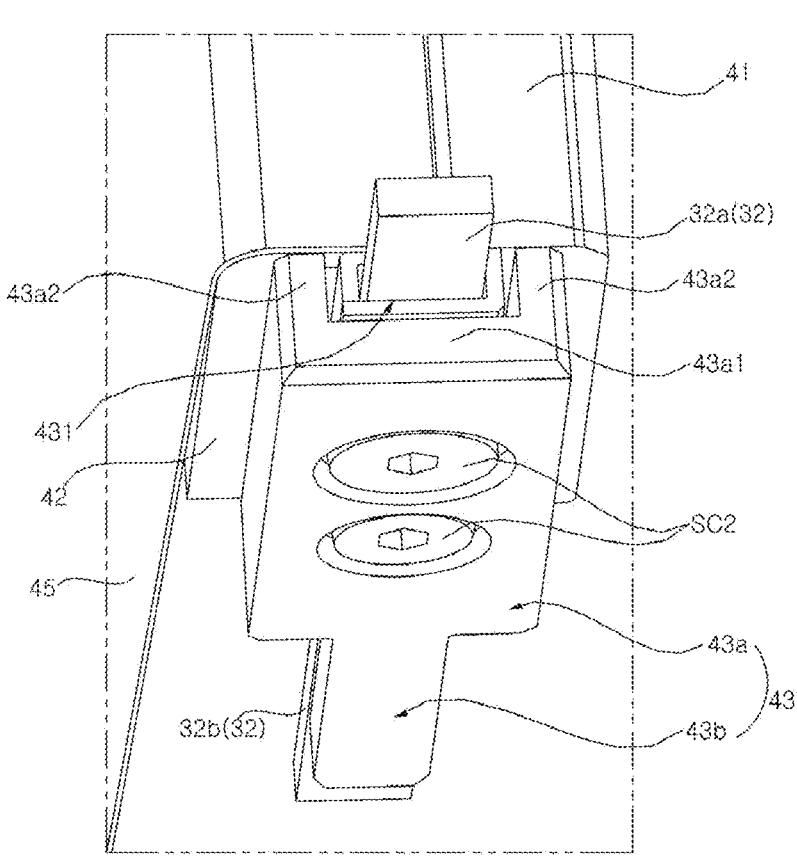

Referring to FIGS. 31 and 32, the belt fixer 43 may include the belt body 43*a* and the fixer tail 43*b*. The belt fixer 43 may be fixed to the piece body 41 and 42 in the state of covering the belt coupler 431 (see FIG. 30). The belt fixer 43 may be coupled or fixed to the piece body 41 and 42 by means of side fastening members SC2. The shafts a of the side fastening members SC2 may be coupled or fixed to the piece body 41 and 42 through the fixer body 43*a* and the belt coupler 431.

The fixer body 43*a* may include an outer cover 43*a*l and side covers 43*a*2. The side fastening members SC2 may pass through the outer cover 43*a*l of the fixer body 43*a*, and may be exposed from the outer surface of the outer cover 43*a*1. The side covers 43*a*2 of the fixer body 43*a* may be formed at two opposite lateral sides of the outer cover 43*a*1. The side covers 43*a*2 may connect the outer cover 43*a*l to the lateral surface of the piece body 41 and 42. The side covers 43*a*2 may be spaced apart from the belt coupler 43*a*1. The two ends of the belt coupler 431 may be exposed to the outside through the outer cover 43*a*l and the side covers 43*a*2. Consequently, the belt 32 may be connected to the belt coupler 431.

Figure 33:
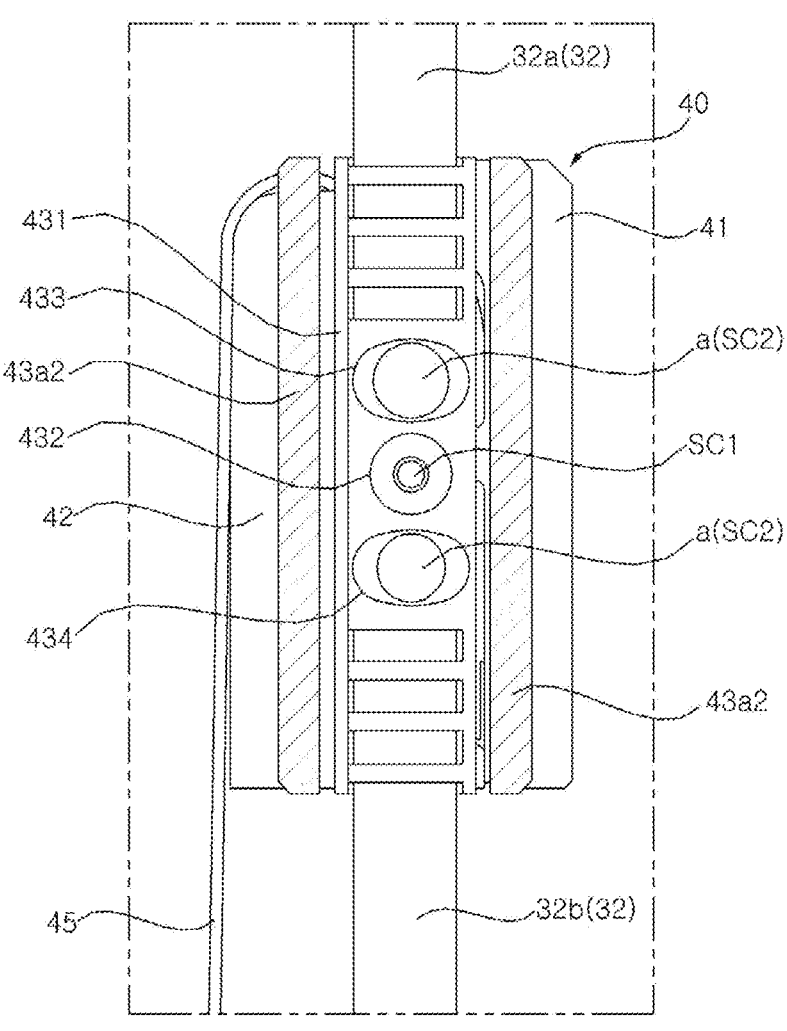
Figure 34:
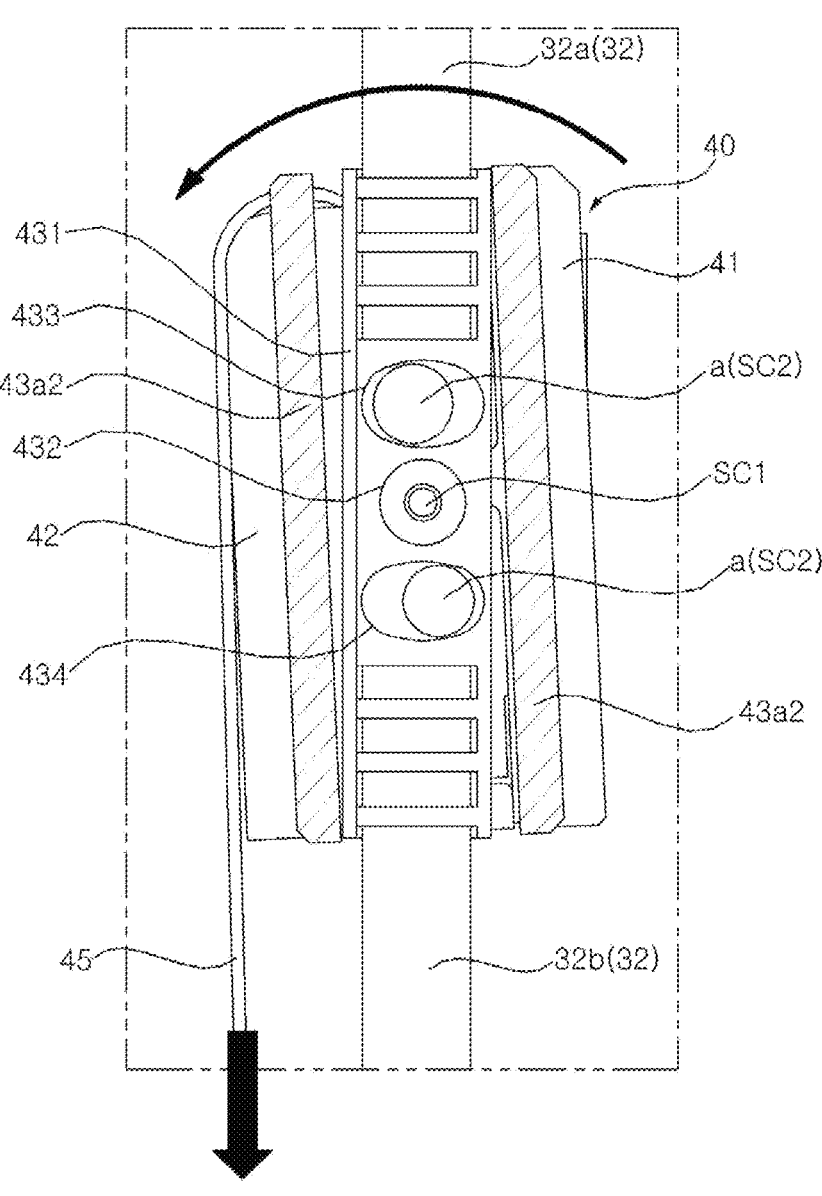

Referring to FIGS. 33 and 34, when the light-shielding sheet 45 is moved in an up-and-down direction by means of the bar 40, tension may be applied to the light-shielding sheet 45. The tension applied to the light-shielding sheet 45 may vary according to movement of the bar 40 and conditions of the light-shielding sheet 45.

When the tension applied to the light-shielding sheet 45 is such an extent that the piece body 41 and 42 of the bar 40 is not rotated, the belt coupler 431 and the belt 32 may be disposed parallel to the fixer body 43*a* (see FIG. 32) and the side covers 43*a*2. Here, the belt coupler 431 may be aligned with the vertical direction.

When the tension applied to the light-shielding sheet 45 is sufficient to rotate the piece body 41 and 42 of the bar 40, the belt coupler 431 and the belt 32 may be rotated about the center fastening member SC1. The belt coupler 431 and/or the belt 32 may be inclined with respect to the side covers 43*a*2 of the fixer body 43*a*. Here, the inner surfaces of the side holes 433 and 434 may catch on the shafts a of the side fastening members SC2, thereby restricting the rotation of the belt coupler 431. Additionally or alternatively, one lateral side or two lateral sides of the belt coupler 431 may come into contact with the side covers 43*a*2 or be supported thereby, and the rotation of the belt coupler 431 may be restricted by the side covers 43*a*2. The rotational range of the belt coupler 431 may be determined according to a size of the side holes 433 and 434 relative to the shafts a of the side fastening members SC2 and/or the distance between the belt coupler 431 and the side covers 43*a*2.

Consequently, it is possible to prevent local wearing of the belt 32 and to prevent generation of noise caused by misalignment between the belt 32 and the pulleys 17 and 31.

Referring to FIGS. 1 to 34, the display device includes a display panel configured to display an image and having translucency, a transparent panel opposed to the display panel, a side frame which extends along a lateral side of the display panel and is coupled to the transparent panel, a belt which is disposed in the side frame and moves in a longitudinal direction of the side frame, a bar which extends in a direction intersecting the side fame and is moved by the belt, a roller which extends along and adjacent to a lower side of the display panel connected to a lateral side of the display panel and is rotatable, a light-shielding sheet which is fixed at one end thereof to the bar and is coupled at another end thereof to the roller, the light-shielding sheet being wound around or unwound from the roller by movement of the bar, an upper pulley which is positioned at an upper side of the side frame and around which the belt is wound, and a driving pulley which is adjacent to a lower side of the side frame and opposed to the light-shielding sheet, the driving pulley being rotated about an axis of a width direction of the light-shielding sheet and the belt being wound around the driving pulley. The bar includes a piece body around which the light-shielding sheet is wound, and a belt coupler fixed to the belt and rotatably coupled to the piece body.

The belt may be constructed so as to have a linear structure having two ends and be wound around the upper pulley and the driving pulley, and the belt coupler may be fixed to the two ends of the belt and be coupled to the piece body between the two ends of the belt.

The belt coupler may include a center hole positioned between the two ends of the belt and a pair of side holes which are opposed to each other based on the center hole, and the belt coupler may be coupled to the piece body so as to be rotatable about the center hole.

The display device may further include a first fastening member fixed to the piece body through the center hole and a pair of second fastening members fixed to the piece body through the pair of side holes. A diameter of the center hole may correspond to an outside diameter of a shaft of the first fastening member, and a diameter of each of the pair or side holes may be larger than an outside diameter of each of the pair of second fastening members.

The display device may further include a belt fixer which covers the belt coupler and is fixed to the piece body, and the belt fixer may include a fixer body through which the belt extends and which is configured to restrict rotation of the belt coupler.

The fixer body may include an outer cover which forms an outer surface of the belt fixer and covers the belt coupler, and a pair of side covers which extend toward the piece body from two lateral sides of the outer cover and in a longitudinal direction of the belt and which covers belt coupler in a state of being spaced apart from the belt coupler.

The belt coupler may include a center hole positioned between the two ends of the belt and a pair of side holes opposed to each other based on the center hole, and the belt coupler may be coupled to the piece body so as to be rotatable about the center hole.

The display device may further include a first fastening member fixed to the piece body through the center hole and a pair of second fastening members fixed to the piece body through the outer cover and the pair of side holes. A diameter of the center hole may correspond to an outside diameter of a shaft of the first fastening member, and a diameter of each of the pair of side holes may be larger than an outside diameter of each of the pair of second fastening members.

The belt fixer may further include a fixer tail which extends toward the driving pulley from the fixer body.

The display device may further include a housing frame which is opposed to the display panel based on the light-shielding sheet and is coupled to the side frame, and a pulley mount which is coupled to the housing frame and which receives the driving pulley, and the pulley mount may include a flange portion fixed to the housing frame, a pulley housing connected to the flange portion, the pulley housing receiving the driving pulley in a rotatable state, a bearing mount which is connected to the pulley housing and covers the driving pulley, and a shaft mount through which a shaft of the driving pulley extends.

The display device may further include a bearing which is fixed to the bearing mount and which is coupled to the driving pulley so as to be rotatable therewith.

The driving pulley may be spaced apart from the light-shielding sheet by a certain distance.

The display device may further include a gear box which is fixed to the housing frame and connected to the shaft of the driving pulley and which is opposed to the light-shielding sheet based on the driving pulley, and a motor which is fixed to the housing frame so as to provide the gear box with rotative force and which is opposed to the light-shielding sheet based on the housing frame.

The display device may further include a joint connecting the shaft of the driving pulley to the gear box, and a rotating counter fixed to a shaft of the motor so as to be rotatable therewith.

The effects of the display device according to the present disclosure will be described.

According to at least one embodiment of the present disclosure, it is possible to provide a display device including a transparent display panel.

According to at least one embodiment of the present disclosure, it is possible to provide a structure and a driving mechanism configured to open and close the rear surface of the transparent display panel.

According to at least one embodiment of the present disclosure, it is possible to provide a mechanism of driving a sheet configured to shield the transparent display panel from light.

According to at least one embodiment of the present disclosure, it is possible to provide a display device capable of preventing local wearing of a belt caused by operation of the light-shielding sheet.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination of the configurations is not explicitly described, the combination is possible except in the case where it is stated that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

What is claimed is:

1. A display device comprising:
    a display panel configured to display an image and having translucency;
    a transparent panel opposed to the display panel;
    a side frame which extends along a lateral side of the display panel and that is coupled to the transparent panel;
    a belt which is disposed in the side frame and that moves in a longitudinal direction of the side fame;
    a bar which extends in a direction intersecting the side frame and that is moved by the belt;
    a roller which extends along and adjacent to a lower side of the display panel connected to a lateral side of the display panel and that is rotatable;
    a light-shielding sheet which is fixed at one end thereof to the bar and that is coupled at another end thereof to the roller, the light-shielding sheet being windable around or unwindable from the roller by respective movements of the bar;
    an upper pulley which is positioned at an upper side of the side frame and around which the belt is wound; and
    a driving pulley which is adjacent to a lower side of the side frame and is opposed to the light-shielding sheet, the driving pulley being rotatable about an axis of a width direction of the light-shielding sheet based on the belt being wound around the driving pulley,
    wherein the bar comprises:
    a piece body around which the light-shielding sheet is windable; and
    a belt coupler fixed to the belt and tiltably coupled to the piece body.

2. The display device according to claim 1, wherein the belt has a linear structure having two ends and is windable around the upper pulley and the driving pulley, and
    wherein the belt coupler is fixed to the two ends of the belt and is coupled to the piece body between the two ends of the belt.

3. The display device according to claim 2, wherein the belt coupler comprises:

a center hole positioned between the two ends of the belt; and a pair of side holes which are opposed to each other based on the center hole, and wherein the belt coupler is coupled to the piece body so as to be rotatable about the center hole.

4. The display device according to claim 3, further comprising:

a first fastening member fixed to the piece body through the center hole; and a pair of second fastening members fixed to the piece body through the pair of side holes, and wherein a diameter of the center hole corresponds to an outside diameter of a shaft of the first fastening member, and a diameter of each of the pair of the side holes is larger than an outside diameter of each of the pair of second fastening members.

5. The display device according to claim 2, further comprising a belt fixer which covers the belt coupler and is fixed to the piece body, wherein the belt fixer comprises a fixer body through which the belt extends and which is configured to restrict rotation of the belt coupler.

6. The display device according to claim 5, wherein the fixer body comprises:

an outer cover which forms an outer surface of the belt fixer and covers the belt coupler; and a pair of side covers which extend toward the piece body from two lateral sides of the outer cover and in a longitudinal direction of the belt and which covers belt coupler in a state of being spaced apart from the belt coupler.

7. The display device according to claim 6, wherein the belt coupler comprises:

a center hole positioned between the two ends of the belt; and a pair of side holes opposed to each other based on the center hole, and wherein the belt coupler is coupled to the piece body so as to be rotatable about the center hole.

8. The display device according to claim 7, further comprising:

a first fastening member fixed to the piece body through the center hole; and a pair of second fastening members fixed to the piece body through the outer cover and the pair of side holes, and wherein a diameter of the center hole corresponds to an outside diameter of a shaft of the first fastening member, and a diameter of each of the pair of side holes is larger than an outside diameter of each of the pair of second fastening members.

9. The display device according to claim 5, wherein the belt fixer further comprises a fixer tail which extends toward the driving pulley from the fixer body.

10. The display device according to claim 1, further comprising:

a housing frame which is opposed to the display panel based on the light-shielding sheet and is coupled to the side frame; and a pulley mount which is coupled to the housing frame and which receives the driving pulley, wherein the pulley mount comprises:

a flange portion fixed to the housing frame;

a pulley housing connected to the flange portion, the pulley housing receiving the driving pulley in a rotatable state;

a bearing mount which is connected to the pulley housing and covers the driving pulley; and a shaft mount through which a shaft of the driving pulley extends.

11. The display device according to claim 10, further comprising a bearing which is fixed to the bearing mount and which is coupled to the driving pulley so as to be rotatable therewith.

12. The display device according to claim 10, wherein the driving pulley is spaced apart from the light-shielding sheet by a certain distance.

13. The display device according to claim 12, further comprising:

a gear box which is fixed to the housing frame and connected to the shaft of the driving pulley and which is opposed to the light-shielding sheet based on the driving pulley; and a motor which is fixed to the housing frame so as to provide the gear box with rotative force and which is opposed to the light-shielding sheet based on the housing frame.

14. The display device according to claim 13, further comprising:

a joint connecting the shaft of the driving pulley to the gear box; and a rotating counter fixed to a shaft of the motor so as to be rotatable therewith.

* * * * *